(12) United States Patent
Nishimura et al.

(10) Patent No.: US 9,660,150 B2
(45) Date of Patent: May 23, 2017

(54) SEMICONDUCTOR LIGHT-EMITTING DEVICE

(71) Applicant: ROHM CO., LTD., Kyoto-shi, Kyoto (JP)

(72) Inventors: Isamu Nishimura, Kyoto (JP); Yasuhiro Fuwa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/139,006

(22) Filed: Apr. 26, 2016

(65) Prior Publication Data

US 2016/0336489 A1    Nov. 17, 2016

(30) Foreign Application Priority Data

May 13, 2015  (JP) ................................ 2015-098443

(51) Int. Cl.
| | |
|---|---|
| *H01L 33/00* | (2010.01) |
| *H01L 33/50* | (2010.01) |
| *H01L 33/32* | (2010.01) |
| *H01L 33/60* | (2010.01) |
| *H01L 33/62* | (2010.01) |
| *H01L 33/56* | (2010.01) |
| *H05B 33/08* | (2006.01) |

(52) U.S. Cl.
CPC ............ *H01L 33/502* (2013.01); *H01L 33/32* (2013.01); *H01L 33/56* (2013.01); *H01L 33/60* (2013.01); *H01L 33/62* (2013.01); *H05B 33/0842* (2013.01)

(58) Field of Classification Search
CPC ... H01L 22/24; H01L 25/048; H01L 27/1427; H01L 27/32; H01L 27/3227
See application file for complete search history.

(56) References Cited

FOREIGN PATENT DOCUMENTS

JP          2014-59981 A      4/2014

*Primary Examiner* — Elias M Ullah
(74) *Attorney, Agent, or Firm* — Hamre, Schumann, Mueller & Larson, P.C.

(57) ABSTRACT

A semiconductor light-emitting device includes a substrate, an LED chip, a control element, a conductive layer and an insulating layer. The substrate, made of a semiconductor material, has an obverse surface and a reverse surface spaced apart from each other in the thickness direction of the substrate. The control element controls light emission of the LED chip. The conductive layer is electrically connected to the LED chip and the control element. The insulating layer is arranged between at least apart of the conductive layer and the substrate. The substrate has a recess formed in the obverse surface, and the LED chip is housed in the recess. The control element is arranged between the LED chip and the reverse surface in the thickness direction of the substrate.

34 Claims, 23 Drawing Sheets

SEMICONDUCTOR LIGHT-EMITTING DEVICE

BACKGROUND OF THE INVENTION

1. Field of the Invention

The present invention relates to a semiconductor light-emitting device.

2. Description of the Related Art

A semiconductor light-emitting device having an LED chip as a light source has been widely used. JP-A-2014-59981 discloses one example of conventional semiconductor light-emitting devices. The semiconductor light-emitting device disclosed in the aforementioned patent literature includes an LED chip and a control element for controlling the light emission of the LED chip. The LED chip and the control element are mounted on the same substrate with a distance from each other.

A semiconductor light-emitting device is generally used as a light-emitting device for an electronic apparatus or the like. In order to respond to downsizing of electronic devices and high-density packaging, there is a strong demand for a smaller semiconductor light-emitting device. However, with an LED chip and a control element arranged with a distance from each other, downsizing of a semiconductor light-emitting device becomes difficult.

SUMMARY OF THE INVENTION

The present invention has been proposed under the above circumstances, and an object thereof is to provide a semiconductor light-emitting device that can be reduced in size.

According to an aspect of the present invention, there is provided a semiconductor light-emitting device that includes: a semiconductor substrate having an obverse surface and a reverse surface that are spaced apart from each other in a thickness direction of the substrate; an LSD chip; a control element for controlling light emission of the LED chip; a conductive layer electrically connected to the LED chip and the control element; and an insulating layer disposed between the substrate and at least a part of the conductive layer. The substrate is formed with a recess that is recessed from the obverse surface of the substrate and houses the LED chip. The control element is arranged between the LED chip and the reverse surface of the substrate in the thickness direction.

With the above-noted arrangements, the control element is disposed between the LED chip and the reverse surface in the thickness direction of the substrate. In this manner, the semiconductor light-emitting device can be downsized compared with a conventional device in which the LED chip and the control element are arranged side by side.

Other features and advantages of the present invention will become apparent from the detailed description given below with reference to the accompanying drawings.

DESCRIPTION OF THE PREFERRED EMBODIMENTS

Hereinafter, preferred embodiments of the present invention will be described in detail with reference to the drawings.

Figure 1:
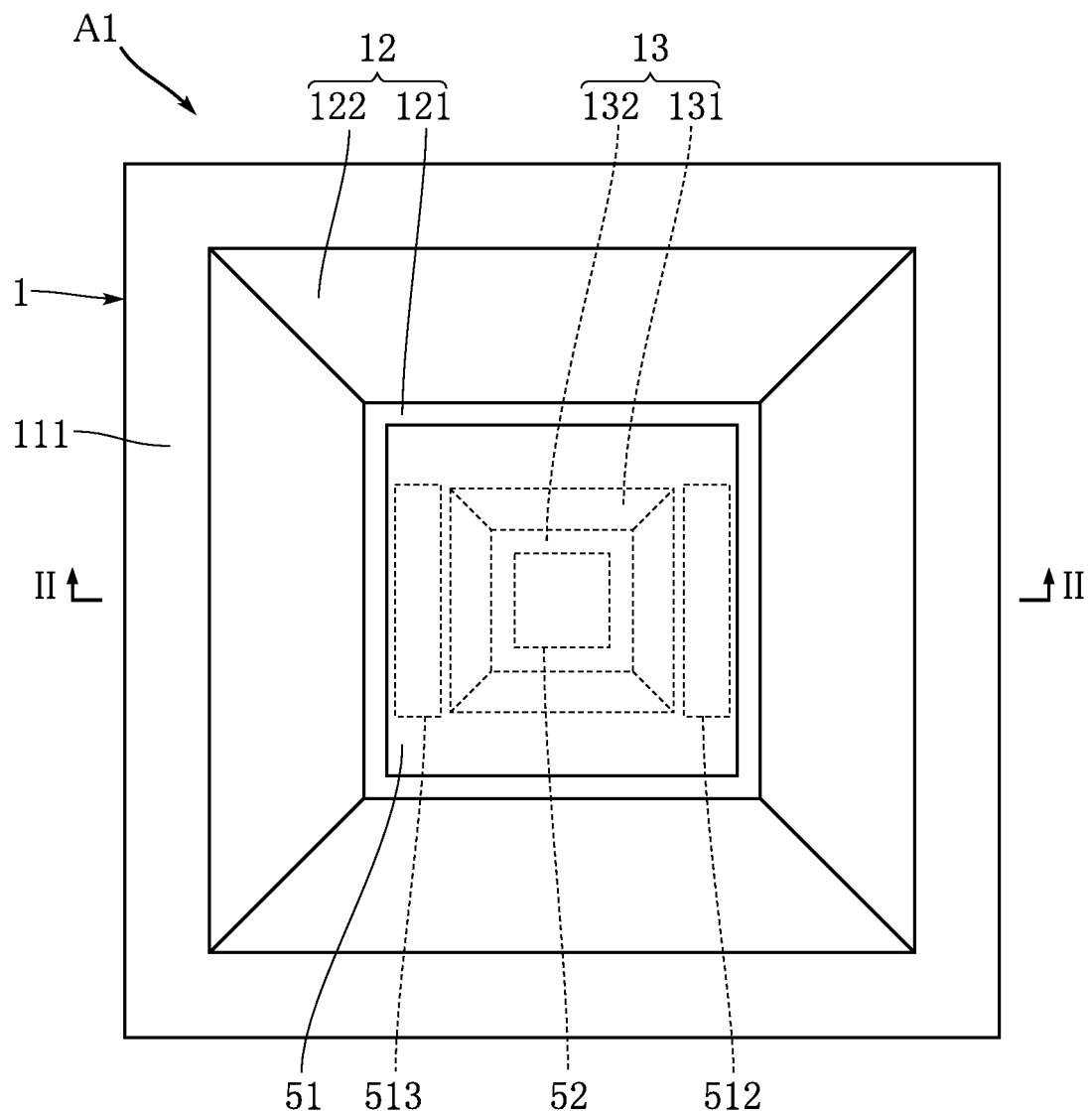
FIG. 1 is a plan view showing a main part of a semiconductor light-emitting device according to a first embodiment of the present invention.
Figure 2:
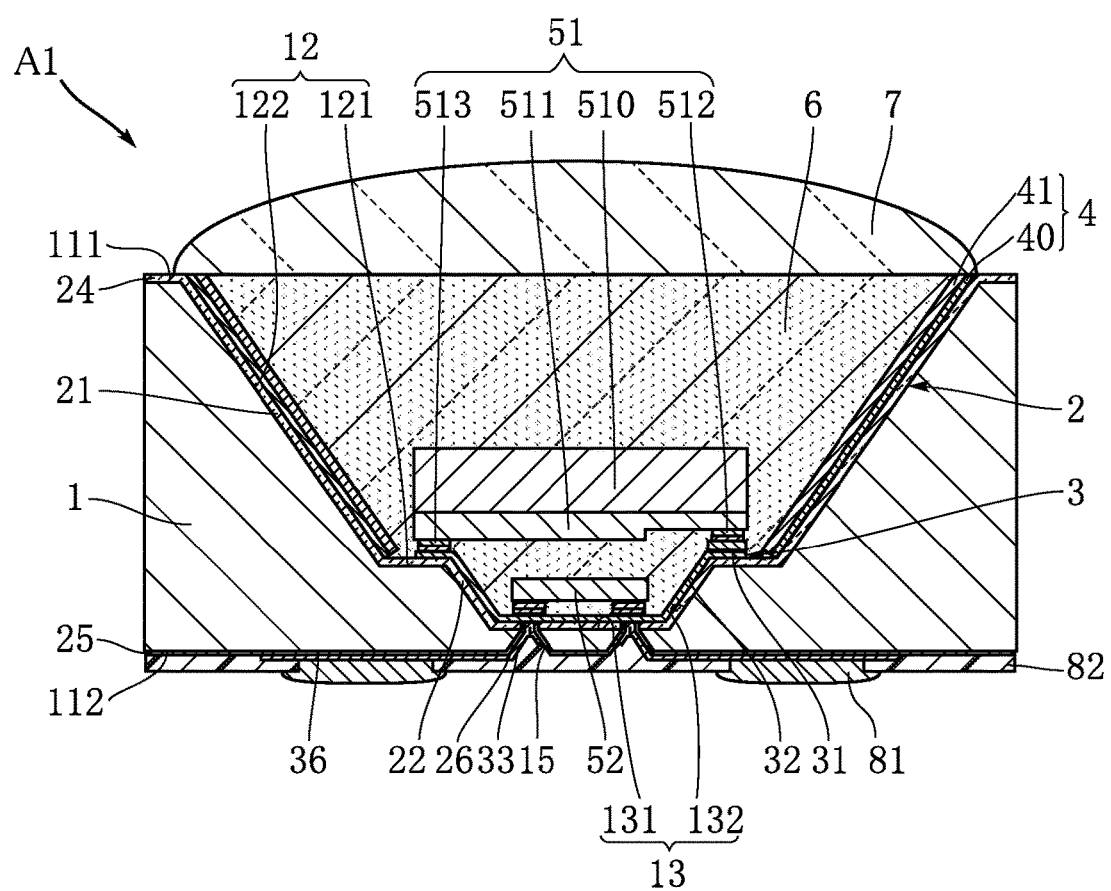
FIG. 2 is a cross-sectional view along a line II-II in FIG. 1.
Figure 3:
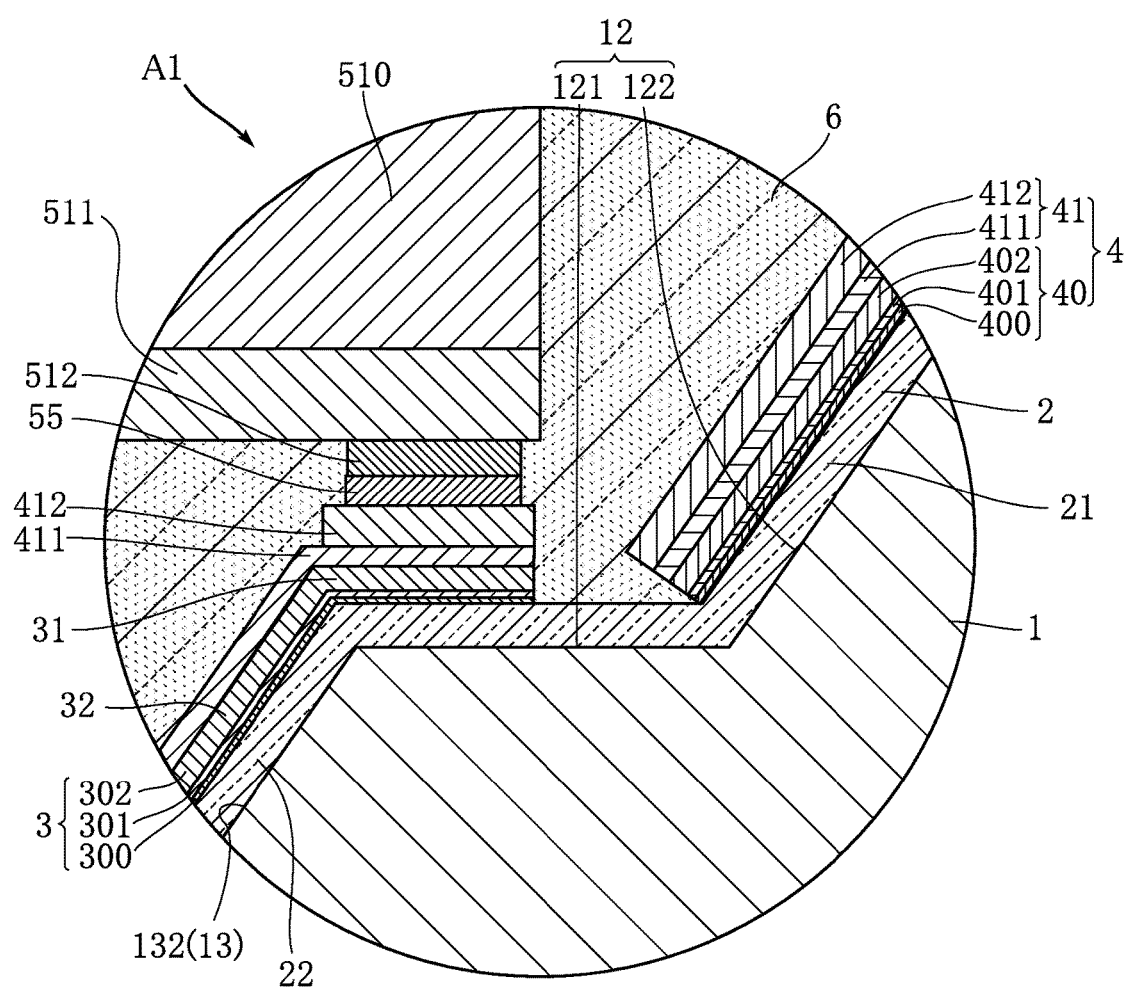
FIG. 3 is an enlarged cross-sectional view showing a main part of the semiconductor light-emitting device in FIG. 1.
Figure 4:
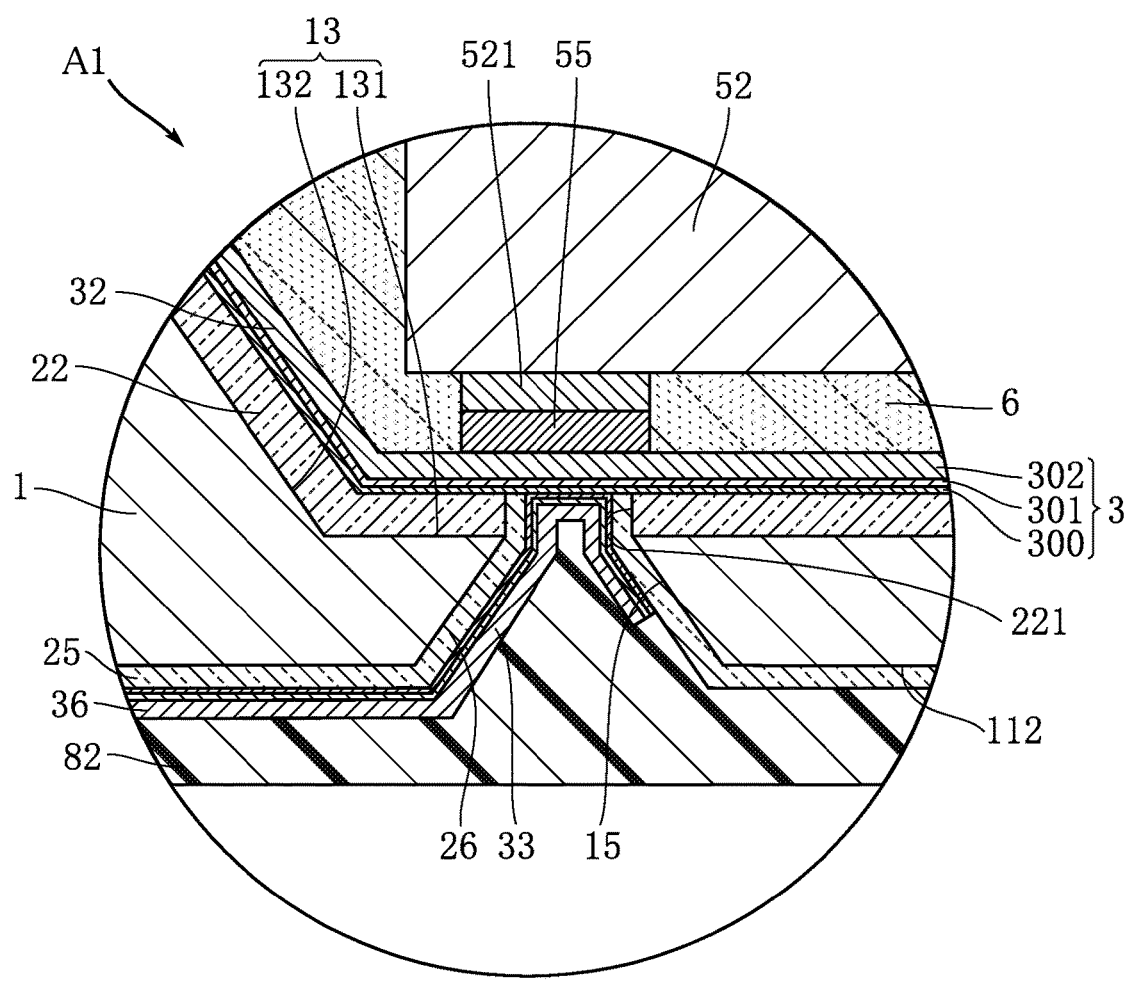
FIG. 4 is an enlarged cross-sectional view showing a main part of the semiconductor light-emitting device in FIG. 1.

FIGS. 1 to 4 show an electronic device according to a first embodiment of the present invention. A semiconductor light-emitting device A1 in the present embodiment includes a substrate 1, an insulating layer 2, a conductive layer 3, a reflective layer 4, an LED chip 51, a control element 52, a sealing resin 6, a lens member 7, reverse-surface electrode pads 81, and a reverse-surface insulating film 82. FIG. 1 is a plan view showing a main part of the semiconductor light-emitting device A1, where the insulating layer 2, the conductive layer 3, the reflective layer 4, the sealing resin 6, and the lens member 7 are omitted to facilitate understanding. FIG. 2 is a cross-sectional view along a line II-II in FIG. 1. FIGS. 3 and 4 are enlarged cross-sectional views showing main parts of the semiconductor light-emitting device A1.

The substrate 1 is made of a monocrystalline semiconductor material. In the present embodiment, the substrate 1 is made of an Si monocrystal. The material of the substrate 1 is not limited to Si, and may be SiC, for example. The substrate 1 has a thickness of 300 to 1000 μm, for example. The LED chip 51 and the control element 52 are arranged on the substrate 1.

The substrate 1 has an obverse surface 111 and a reverse surface 112 that are spaced apart from each other in a thickness direction of the substrate 1.

In FIG. 2, the obverse surface 111 upward in the thickness direction of the substrate 1. The obverse surface 111 is flat, The obverse surface 111 is perpendicular to the thickness direction. The obverse surface 111 is either a (100) surface or a (110) surface. In the present embodiment, the obverse surface 111 is a (100) surface.

The reverse surface 112 faces downward in the thickness direction. Thus, the reverse surface 112 and the obverse surface 111 face opposite to each other. The reverse surface 112 is flat. The reverse surface 112 is perpendicular to the thickness direction.

The substrate 1 has an LED-chip-receiving recess 12, an obverse-side control-element-receiving recess 13, and two substrate through-holes 15.

The LED-chip-receiving recess 12 is recessed from the obverse surface 111. The LED chip 51 is arranged in the LED-chip-receiving recess 12. The LED-chip-receiving recess 12 has a depth (a separation distance in the thickness direction between the obverse surface 111 and an obverse-side control-element-receiving recess bottom surface 131, which is described below) of 200 to 500 μm, for example. The LED-chip-receiving recess 12 is rectangular as viewed in the thickness direction. The shape of the LED-chip-receiving recess 12 results from the obverse surface 111 being a (100) surface.

The LED-chip-receiving recess 12 has an LED-chip-receiving recess bottom surface 121 and LED-chip-receiving recess side surfaces 122.

The LED-chip-receiving recess bottom surface 121 face the same side as the obverse surface 111 in the thickness direction of the substrate 1. The LED-chip-receiving recess bottom surface 121 has a rectangular ring shape as viewed in the thickness direction, and is flat. The LED chip 51 is arranged on the LED-chip-receiving recess bottom surface 121. The LED-chip-receiving recess bottom surface 121 is perpendicular to the thickness direction.

The LED-chip-receiving recess side surfaces 122 upstand from the LED-chip-receiving recess bottom surface 121. The LED-chip-receiving recess side surfaces 122 are continuous with the obverse surface 111. The LED-chip-receiving recess side surfaces 122 are inclined relative to the thickness direction. The LED-chip-receiving recess side surfaces 122 each form an angle of 55° with a plane perpendicular to the thickness direction. This results from the obverse surface 111 being a (100) surface. The LED-chip-receiving recess side surfaces 122 are four in number and flat.

The obverse-side control-element-receiving recess 13 is recessed from the LED-chip-receiving recess bottom surface 121 of the LED-chip-receiving recess 12. The control element 52 is arranged in the obverse-side control-element-receiving recess 13. The obverse-side control-element-receiving recess 13 has a depth (a separation distance in the thickness direction between the LED-chip-receiving recess bottom surface 121 and an obverse-side control-element-receiving recess bottom surface 131, which is described below) of 50 to 300 μm, for example. The obverse-side control-element-receiving recess 13 is rectangular as viewed in the thickness direction. The shape of the obverse-side control-element-receiving recess 13 results from the obverse surface 111 being a (100) surface.

The obverse-side control-element-receiving recess 13 has an obverse-side control-element-receiving recess bottom surface 131 and obverse-side control-element-receiving recess side surfaces 132.

The obverse-side control-element-receiving recess bottom surface 131 faces the same side as the obverse surface 111 in the thickness direction of the substrate 1. The obverse-side control-element-receiving recess bottom surface 131 is rectangular as viewed in the thickness direction. The control element 52 is arranged on the obverse-side control-element-receiving recess bottom surface 131. The obverse-side control-element-receiving recess bottom surface 131 is perpendicular to the thickness direction.

The obverse-side control-element-receiving recess side surfaces 132 upstand from the obverse-side control-element-receiving recess bottom surface 131. The obverse-side control-element-receiving recess side surfaces 132 are continuous with the observe-side control-element-receiving recess bottom surface 131. Also, the obverse-side control-element-receiving recess side surfaces 132 are continuous with the LED-chip-receiving recess bottom surface 121. The obverse-side control-element-receiving recess side surfaces 132 are inclined relative to the thickness direction. The obverse-side control-element-receiving recess side surfaces 132 each form an angle of 55° with a plane perpendicular to the thickness direction. This results from the obverse surface 111 being a (100) surface. The obverse-side control-element-receiving recess side surfaces 132 are four in number and flat.

The substrate through-holes 15 penetrate through a part of the substrate 1, from the obverse-side control-element-receiving recess bottom surface 131 to the reverse surface 112. In the present embodiment, the substrate through-holes 15 are plural (two) in number. The substrate through-holes 15 have a depth of 10 to 50 µm, for example. As viewed in the thickness direction of the substrate 1, the substrate through-holes 15 each have a maximum opening dimension of 10 to 50 µm, for example. The ratio of the depth of the substrate through-holes 15 to the maximum opening dimension of the substrate through-holes 15 is 0.2 to 5. In the embodiment, the substrate through-holes 15 are rectangular as viewed in the thickness direction. In another embodiment, the substrate through-holes 15 may be square as viewed in the thickness direction. The substrate through-holes 15 each increase in cross-sectional dimension with increasing distance from the obverse surface 111 toward the reverse surface 112 in the thickness direction.

Inner surfaces of the substrate through-holes 15 are inclined relative to the thickness direction of the substrate 1. The substrate through-holes 15 each have four inner flat surfaces. The inner surfaces of the substrate through-holes 15 each form an angle of 55° with a plane perpendicular to the thickness direction. This results from the obverse surface 111 feeing a (100) surface.

The insulating layer 2 is sandwiched between the conductive layer 3 and the substrate 1. The insulating layer 2 has a thickness of about 0.1 to 1.0 µm, for example. The insulating layer 2 is made of $SiO_2$ or SiN, for example.

The insulating layer 2 has an LED-chip-receiving recess insulating region 21, an obverse-side control-element-receiving recess insulating region 22, an obverse-surface insulating region 24, a reverse-surface insulating region 25, and through-hole insulating region 26.

The LED-chip-receiving recess insulating region 21 is formed in the LED-chip-receiving recess 12 of the substrate 1. In the present embodiment, the LED-chip-receiving recess insulating region 21 covers all of the LED-chip-receiving recess bottom surface 121 and the LED-chip-receiving recess side surfaces 122. The LED-chip-receiving recess insulating region 21 is formed by thermal oxidation, for example. The LED-chip-receiving recess insulating region 21 is made of $SiO_2$, for example.

The obverse-side control-element-receiving recess insulating region 22 is formed in the obverse-side control-element-receiving recess 13 of the substrate 1. In the present embodiment, the obverse-side control-element-receiving recess insulating region 22 covers all of the obverse-side control-element-receiving recess bottom surface 131 and the obverse-side control-element-receiving recess side surfaces 132. The obverse-side control-element-receiving recess insulating region 22 is formed by thermal oxidation, for example. The obverse-side control-element-receiving recess insulating region 22 is made of $SiO_2$, for example.

As shown in FIG. 4, the obverse-side control-element-receiving recess insulating region 22 has insulating-layer through holes 221. The insulating-layer through holes 221 penetrate through the obverse-side control-element-receiving recess insulating region 22 in the thickness direction. The insulating-layer through holes 221 are positioned within the substrate through-holes 15 as viewed in the thickness direction. The insulating-layer through holes 221 each have a constant cross-sectional shape in the thickness direction.

The through-hole insulating region 26 covers the inner surfaces of the substrate through-holes 15 and the inner surfaces of the insulating-layer through holes 221. The through-hole insulating region 26 is formed by chemical vapor deposition (CVD), for example. The through-hole insulating region 26 is made of either $SiO_2$ or SiN, for example. Note that the through-hole insulating region 26 does not close the substrate through-holes 15.

The obverse-surface insulating region 24 is formed on the obverse surface 111 of the substrate 1. The obverse-surface insulating region 24 is formed by thermal oxidation. The obverse-surface insulating region 24 is made of $SiO_2$, for example. In the present embodiment, the obverse-surface insulating region 24 covers the entirety of the obverse surface 111.

The reverse-surface insulating region 25 is formed on the reverse surface 112 of the substrate 1. The reverse-surface insulating region 25 is formed by thermal oxidation or CVD. The reverse-surface insulating region 25 is made of $SiO_2$, for example. In the present embodiment, the reverse-surface insulating region 25 covers the entirety of the reverse surface 112.

The conductive layer 3 is electrically connected to the LED chip 51 and the control element 52. The conductive layer 3 forms a current path through which electric current flows in and out of the LED chip 51 and the control element 52.

As shown in FIGS. 3 and 4, the conductive layer 3 includes an underlying layer 300, a seed layer 301, and a plating layer 302.

The underlying layer 300 allows the conductive layer 3 to be in close contact with the substrate 1. The underlying layer 300 is formed by sputtering, for example. The underlying layer 300 is made of Ti, for example. The underlying layer 300 has a thickness of 0.05 µm to 0.3 µm, for example. The seed layer 301 is provided so as to form a desired plating layer.

The seed layer 301 is sandwiched between the underlying layer 300 and the plating layer 302. The seed layer 301 is made of Cu, for example. The seed layer 301 is formed by sputtering, for example. The seed layer 301 has a thickness of 0.1 µm to 0.8 µm, for example.

The plating layer 302 is formed by electroplating using the seed layer 301. The plating layer 302 is made of Cu, for example. The plating layer 302 has a thickness of about 3 to 10 µm, for example. The plating layer 302 is thicker than the underlying layer 300 and the seed layer 301.

The conductive layer 3 includes an LED-chip-receiving recess conductive region 31, an obverse-side control-element-receiving recess conductive region 32, a substrate through-hole conductive region 33, and a reverse-surface conductive region 36. The LED-chip-receiving recess conductive region 31, the obverse-side control-element-receiving recess conductive region 32, the substrate through-hole conductive region 33, and the reverse-surface conductive region 36 are electrically connected to each other.

The LED-chip-receiving recess conductive region 31 is formed within the LED-chip-receiving recess 12, and in particular includes a portion formed on the LED-chip-receiving recess bottom surface 121. In addition, the LED-chip-receiving recess conductive region 31 may include portions formed on the LED-chip-receiving recess side surfaces 122. The LED-chip-receiving recess conductive region 31 formed on the LED-chip-receiving recess bottom surface 121 is used to mount an n-side electrode 512 and a p-side electrode 513 of the LED chip 51 on the LED-chip-receiving recess bottom surface 121 via solder 55.

The obverse-side control-element-receiving recess conductive region 32 is formed in the obverse-side control-element-receiving recess 13. In the present embodiment, the obverse-side control-element-receiving recess conductive region 32 includes portions formed on the obverse-side control-element-receiving recess bottom surface 131 and on the obverse-side control-element-receiving recess side surfaces 132. The obverse-side control-element-receiving recess conductive region 32 formed on the obverse-side control-element-receiving recess bottom surface 131 is used to dispose a mount terminal of the control element 52 on the obverse-side control-element-receiving recess bottom surface 131 via the solder 55. At openings of the substrate through-holes 15 located on the side of the obverse surface 111, portions of the obverse-side control-element-receiving recess conductive region 32 are exposed to the reverse surface 112.

The substrate through-hole conductive region 33 includes portions formed on the inner surfaces of the substrate through-holes 15. In the present embodiment, as shown in FIG. 4, the substrate through-hole conductive region 33 is layered on the through-hole insulating region 26 of the insulating layer 2 at the inner surfaces of the substrate through-holes 15. Also, the substrate through-hole conductive region 33 is in contact with the obverse-side control-element-receiving recess conductive region 32 at the openings of the substrate through-holes 15 on the side of the obverse surface 111.

The reverse-surface conductive region 36 is formed at the reverse surface 112 of the substrate 1. In the present embodiment, the reverse-surface conductive region 36 is layered on the reverse-surface insulating region 25 that covers the entirety of the reverse surface 112. The reverse-surface conductive region 36 is continuous with the substrate through-hole conductive region 33.

The reflective layer 4 is formed at the LED-chip-receiving recess side surfaces 122, and reflects light from the LED chip 51 toward the obverse surface 111. In the present embodiment, the reflection layer 4 is stacked on the LED-chip-receiving recess insulating region 21 of the insulating layer 2. Also, the reflective layer 4 is insulated from the conductive layer 3.

As shown in FIG. 3, the reflective layer 4 is composed of a base layer 40 and a Ag layer 41.

The base layer 40 is formed on the LED-chip-receiving recess insulating region 21, and is composed of an underlying layer 400, a seed layer 401, and a plating layer 402. In the present embodiment, the underlying layer 400 is the same in characteristic as the underlying layer 300 of the conductive layer 3, the seed layer 401 is the same in characteristic as the seed layer 301 of the conductive layer 3, and the plating layer 402 is the same in characteristic as the plating layer 302 of the conductive layer 3. In other words, the base layer 40 has the same layer structure as the conductive layer 3.

The Ag layer 41 is composed of a lower layer 411 and an upper layer 412. The lower layer 411 and the upper layer 412 are made of Ag. The upper layer 412 is the outermost layer of the Ag layer 41. The lower layer 411 has a thickness of 3 μm to 10 μm, for example. The upper layer 412 is thicker than the lower layer 411, for example.

In the present embodiment, the lower layer 411 is stacked on the LED-chip-receiving recess conductive region 31 and the obverse-side control-element-receiving recess conductive region 32 of the conductive layer 3. Accordingly, the lower layer 411 is sandwiched between the n-side and p-side electrodes 512, 513 of the LED chip 51 and the LED-chip-receiving recess conductive region 31. Also, the lower layer 411 is sandwiched between a mounting terminal 521 and the obverse-side control-element-receiving recess conductive region 32. Furthermore, as shown in FIG. 3, the upper layer 412 is sandwiched between the n-side electrode 512 of the LED chip 51 and the lower layer 411. The upper layer 412 is designed to have a thickness corresponding to the step formed in a semiconductor layer 511 (see e.g. FIG. 2).

The LED chip 51 is mounted on the LED-chip-receiving recess bottom surface 121. For example, the LED chip 51 has a support substrate 510, the semiconductor layer 511, the n-side electrode 512, and the p-side electrode 513. The LED chip 51 is a flip-chip LED chip which is mounted without use of wire and the like.

The support substrate 510 serves as a base for the LED chip 51, and is a sapphire substrate, for example. The semiconductor layer 511 is composed of a plurality of semiconductor layers stacked on the support substrate 510. The semiconductor layer 511 includes an active layer, for example. If the semiconductor layer 511 is made of a GaN-based semiconductor, for example, the LED chip 51 emits blue light. The n-side electrode 512 is electrically connected to an n-type semiconductor layer of the semiconductor layer 511. The p-side electrode 513 is electrically connected to a p-type semiconductor layer of the semiconductor layer 511. The n-side electrode 512 and the p-side electrode 513 are made of Au or Al, for example. The LED chip 51 may further include a reflective layer that reflects light from the active layer of the semiconductor layer 511 to the support substrate 510.

The control element 52 is mounted on the obverse-side control-element-receiving recess bottom surface 131, and controls light emission of the LED chip 51. Examples of the control element 52 include an integrated circuit element, such as an application-specific integrated circuit (ASIC) element, that actively controls the magnitude of the current supplied to the LED chip 51 and controls turning on/off of the current; and a passive element, such as a chip resistor, an inductor, or a capacitor, that passively controls current supplied to the LED chip 51.

The control element 52 is positioned between the LED chip 51 and the reverse surface 112 in the thickness direction of the substrate 1. The LED chip 51 and the control element 52 overlap with each other as viewed in the thickness direction of the substrate 1. More specifically, it suffices for the LED chip 51 and the control element 52 to partially coincide with each other as viewed in the thickness direction. For example, the control element 52 may be entirely covered with the LED chip 51 as viewed in the thickness direction. Alternatively, the control element 52 may be partially exposed from the LED chip 51 as viewed in the thickness direction.

The reverse-surface insulating film 82 is at least partially formed on the reverse surface 112. The reverse-surface insulating film 82 is made of SiN, for example. The reverse-surface insulating film 32 is formed by CVD, for example. The reverse-surface insulating film 82 has a plurality of openings.

The reverse-surface electrode pads 81 are electrically connected to the reverse-surface conductive region 36 of the conductive layer 3 via the openings of the reverse-surface insulating film 82. The reverse-surface electrode pads 81 are provided so as to mount the semiconductor light-emitting device A1 on a circuit board or the like. Each of the reverse-surface electrode pads 81 is made of a single layer or a plurality of layers of metal, such as Ti, Ni, or Au.

The sealing resin 6 fills the LED-chip-receiving recess 12 and the obverse-side control-element-receiving recess 13, and covers the LED chip 51 and the control element 52. The sealing resin 6 contains a transparent resin material such as epoxy resin or silicone resin, and a fluorescent material mixed in the resin material. The fluorescent material emits light at a different wavelength upon excitation by light from the LED chip 51. For example, if the LED chip 51 emits blue light, the fluorescent material emits yellow light by excitation. Alternatively, if the LED chip 51 emits red light, the sealing resin 6 may be made solely of a transparent resin material.

The lens member 7 covers the sealing resin 6, and enhances the directivity of light from the LED chip 51. The lens member 7 is made of transparent epoxy resin or silicone resin, for example. The lens member 7 is formed by dripping a liquid resin material onto the sealing resin 6, and curing the liquid resin material.

Next, an example of a method for manufacturing the semiconductor light-emitting device A1 is described with reference to FIGS. 5 to 17.

Figure 5:
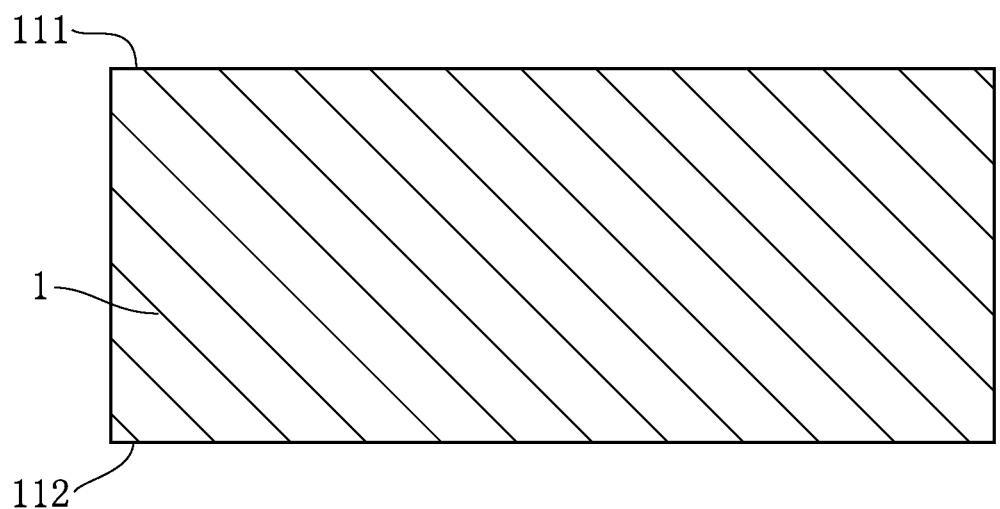
FIG. 5 is a cross-sectional view showing an example of a method for manufacturing the semiconductor light-emitting device in FIG. 1.

First, a substrate 1 is prepared as shown in FIG. 5. The substrate 1 is made of a monocrystal semiconductor material. In the present embodiment, the substrate 1 is made of Si monocrystal. The substrate 1 has a thickness of about 300 to 1000 μm, for example. Although a single semiconductor light-emitting device A1 may be manufactured through the following manufacturing steps, it is more practical to collectively manufacture a plurality of semiconductor light-emitting devices A1 in view of industrial efficiency. Although the substrate 1 shown in FIG. 5 is not precisely identical to the substrate 1 of the semiconductor light-emitting device A1, both of the substrates are referred to as "substrate 1" to facilitate understanding, The substrate 1 has an obverse surface 111 and a reverse surface 112 that face opposite to each other. In the present embodiment, the obverse surface 111 is a (100) surface, which is a surface having a crystal orientation of (100).

Next, the obverse surface 111 is for example oxidized to form a mask layer made of $SiO_2$. The mask layer has a thickness of about 0.7 to 1.0 μm, for example.

Next, the mask layer is patterned by etching, for example. As a result, an opening having for example a rectangular shape is formed in the mask layer. The shape and size of the opening is determined according to the shape and size of an obverse-side control-element-receiving recess 13 in its final form.

Next, the substrate 1 is subjected to anisotropic etching using, for example, KOH. KOH is an example of an alkaline etching solution appropriately usable for anisotropic etching of Si monocrystal. Through the etching, a recess is formed in the substrate 1. The recess has a bottom surface and side surfaces. The bottom surface is at a right angle to the thickness direction. The side surfaces each form an angle of about 55° with a plane perpendicular to the thickness direction.

Figure 6:
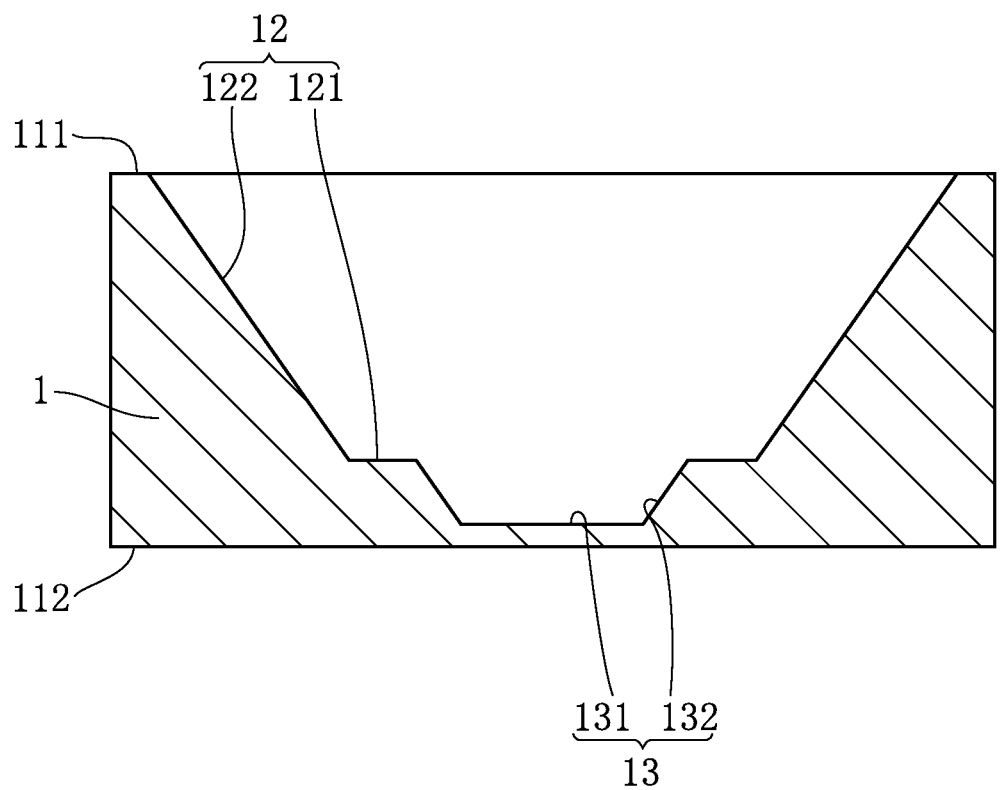
FIG. 6 is a cross-sectional view showing an example of a method for manufacturing the semiconductor light-emitting device in FIG. 1.

Next, the opening of the mask layer is enlarged. Subsequently, the anisotropic etching using KOH as described above is performed. Then, the mask layer is removed. As a result of this two-step etching, an LED-chip-receiving recess 12 and an obverse-side control-element-receiving recess 13 as shown in FIG. 6 are formed. The LED-chip-receiving recess 12 has an LED-chip-receiving recess bottom surface 121 and LED-chip-receiving recess side surfaces 122. The LED-chip-receiving recess 12 is recessed from the obverse surface 111. The obverse-side control-element-receiving recess 13 has an obverse-side control-element-receiving recess bottom surface 131 and obverse-side control-element-receiving recess side surfaces 132. The obverse-side control-element-receiving recess 13 is recessed from the LED-chip-receiving recess bottom surface 121 of the LED-chip-receiving recess 12. The LED-chip-receiving recess 12 and the obverse-side control-element-receiving recess 13 have rectangular shapes as viewed in the thickness direction.

Figure 7:
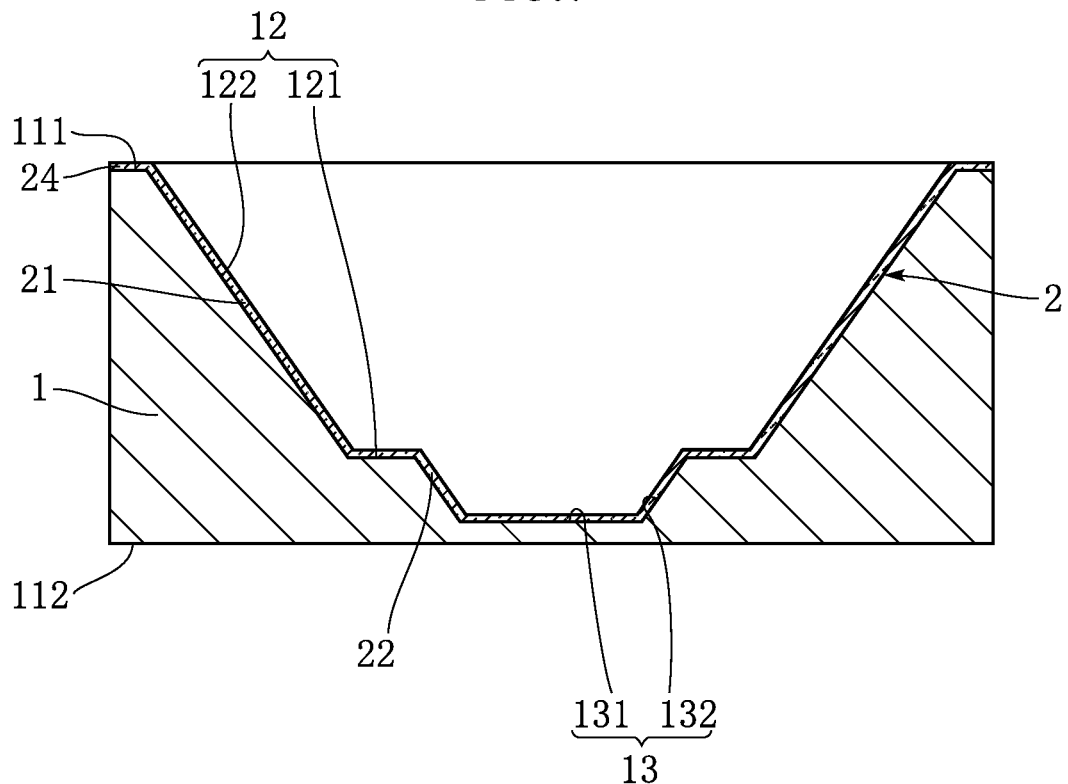
FIG. 7 is a cross-sectional view showing an example of a method for manufacturing the semiconductor light-emitting device in FIG. 1.

Next, as shown in FIG. 7, thermal oxidation is performed to form an insulating layer 2 on the LED-chip-receiving recess bottom surface 121, the LED-chip-receiving recess side surfaces 122, the obverse-side control-element-receiving recess bottom surface 131, and the obverse-side control-element-receiving recess side surfaces 132. This insulating layer 2 includes the LED-chip-receiving recess insulating region 21 and the obverse-side control-element-receiving recess insulating region 22 as described above.

Figure 8:
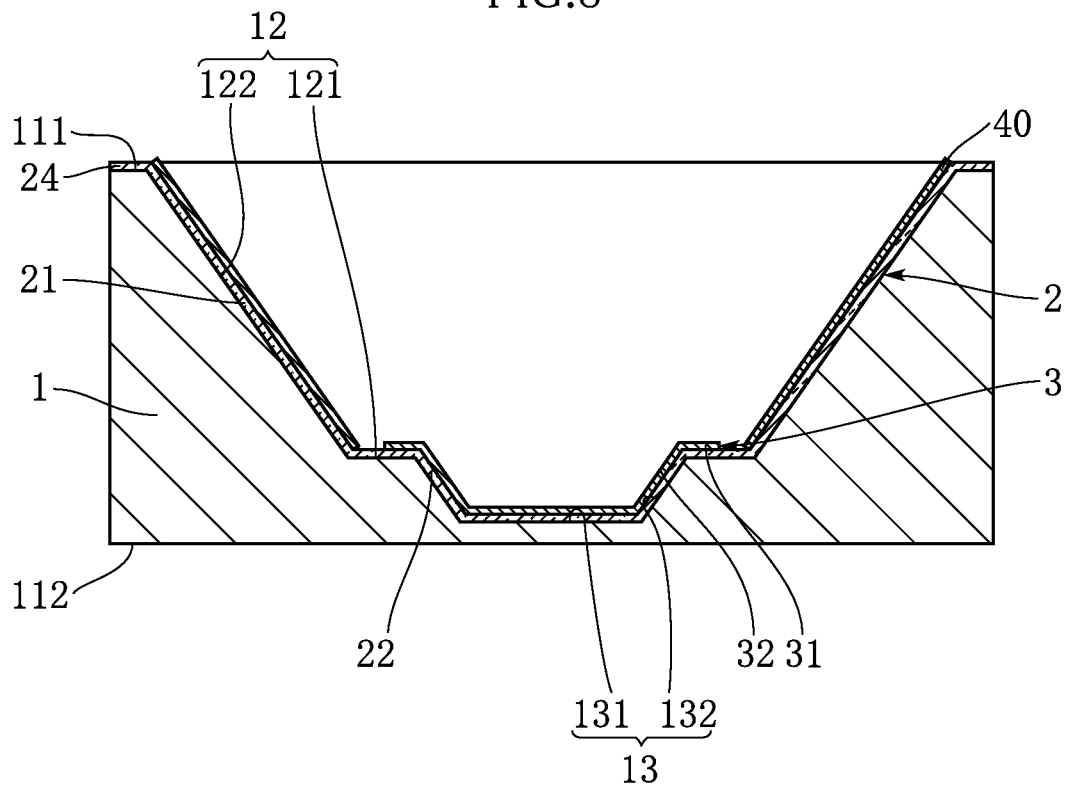
FIG. 8 is a cross-sectional view showing an example of a method for manufacturing the semiconductor light-emitting device in FIG. 1.

Next, an underlying layer 300, a seed layer 301, and a plating layer 302 are formed. The under lying layer 300 is formed by sputtering using Ti, for example. The seed layer 301 is formed by sputtering using Cu, for example. The plating layer 302 is formed by electroplating with use of the seed layer 301 covered with a patterned mask layer. Then, unnecessary parts of the mask layer, the underlying layer 300, and the seed layer 301 are removed by etching or the like. As a result, the conductive layer 3 including the seed layer 301 and the plating layer 302 is formed as shown in FIG. 8. At this time, the conductive layer 3 has the shape that includes the LED-chip-receiving recess conductive region 31 and the obverse-side control-element-receiving recess conductive region 32, for example. Furthermore, in the present embodiment, a base layer 40 is formed on the LED-chip-receiving recess side surfaces 122. The base layer 40 is composed of an underlying layer 400, a seed layer 401, and a plating layer 402 which are the same in characteristic as the underlying layer 300, the seed layer 301, and the plating layer 302.

Figure 9:
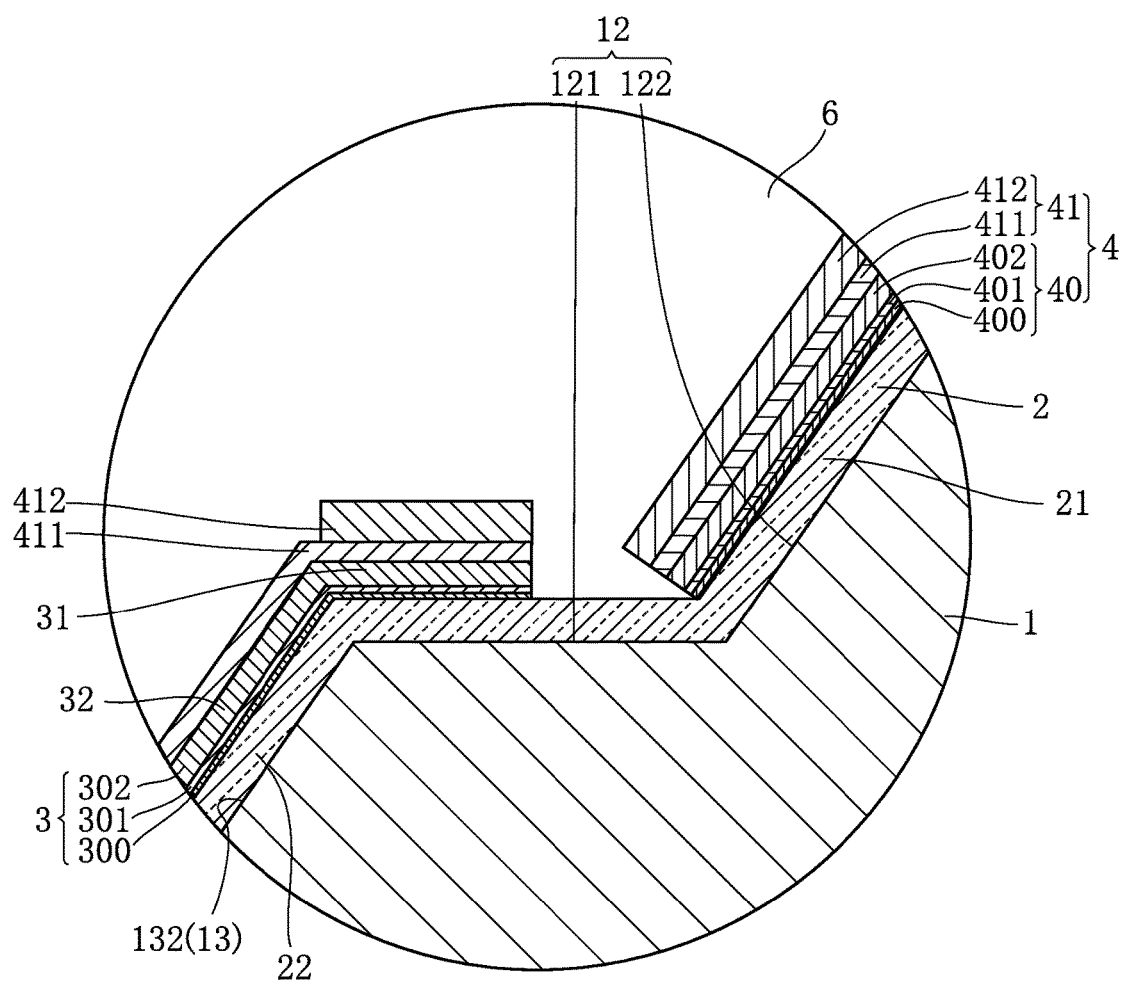
FIG. 9 is an enlarged cross-sectional view showing an example of a method for manufacturing the semiconductor light-emitting device in FIG. 1.
Figure 10:
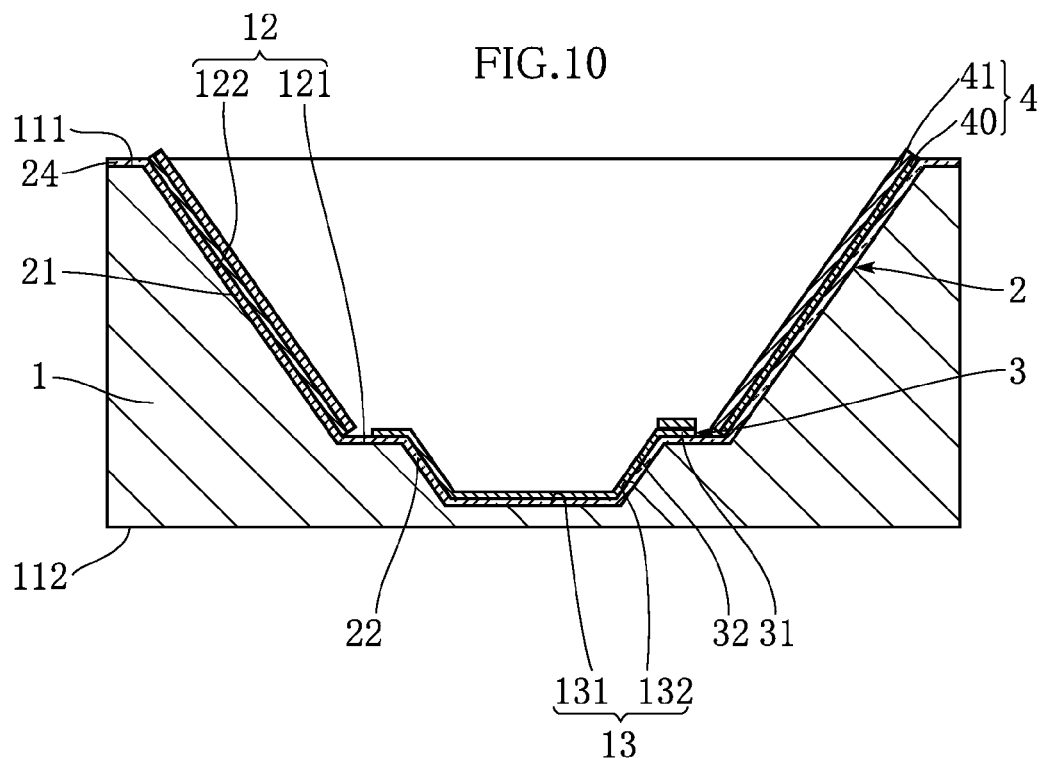
FIG. 10 is a cross-sectional view showing an example of a method for manufacturing the semiconductor light-emitting device in FIG. 1.

Next, as shown in FIGS. 9 and 10, a lower layer 411 and an upper layer 412 are formed. The lower layer 411 is formed by, for example, applying Ag-plating to the entire surfaces of the conductive layer 3 and the base layer 40 shown in the figures. The upper layer 412 is formed on a part of the lower layer 411 stacked on the base layer 40 and on a part of the lower layer 411 for joining an n-side electrode 512 which is described above. In this way, a reflective layer 4, which is composed of the base layer 40 and a Ag layer 41, is formed. Also, a part for joining the n-side electrode 512 is raised by the Ag layer 41.

Figure 11:
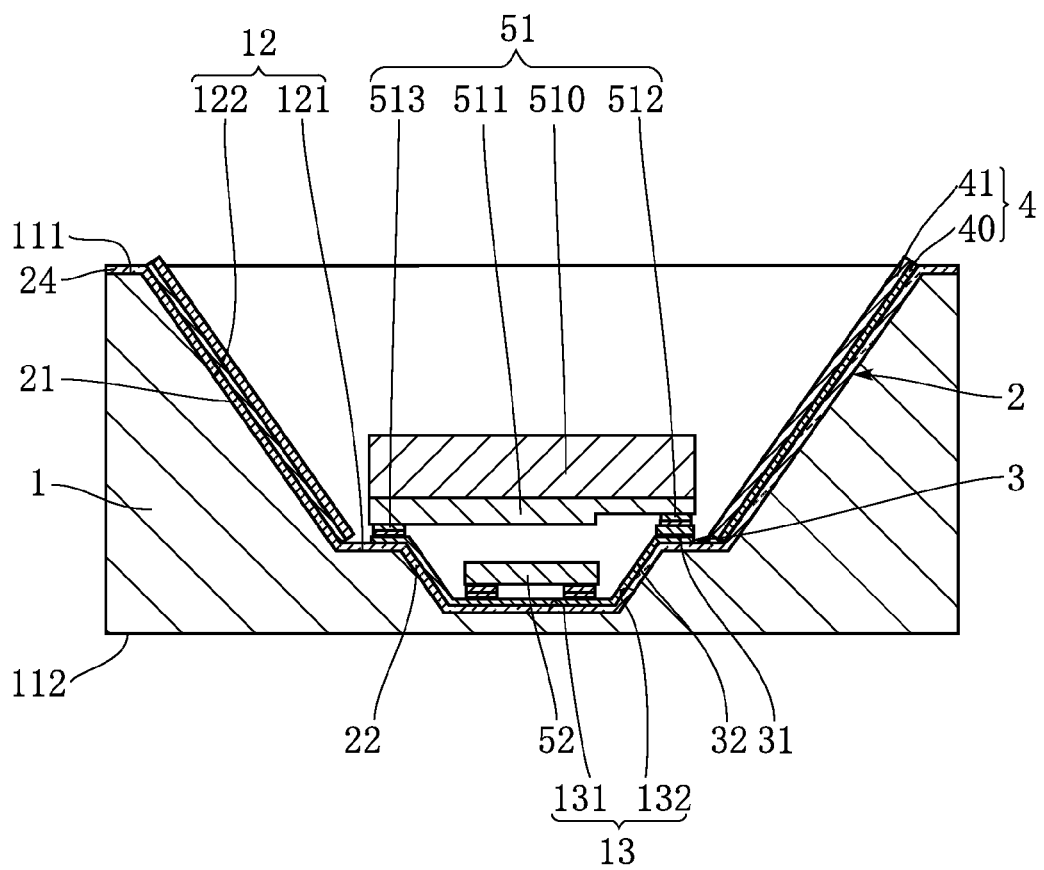
FIG. 11 is a cross-sectional view showing an example of a method for manufacturing the semiconductor light-emitting device in FIG. 1.

Next, as shown in FIG. 11, a control element 52 is arranged in an obverse-side control-element-receiving recess 13. More specifically, a mounting terminal 521 of the control element 52 is joined to the obverse-side control-element-receiving recess conductive region 32 of the obverse-side control-element-receiving recess bottom surface 131 by solder 55. Also, an LED chip 51 is arranged in the LED-chip-receiving recess 12. More specifically, the n-side electrode 512 of the LED chip 51 and a p-side electrode 513 of the LED chip 51 are joined to the LED-chip-receiving recess conductive region 31 of the LED-chip-receiving recess bottom surface 121 by the solder 55.

Figure 12:
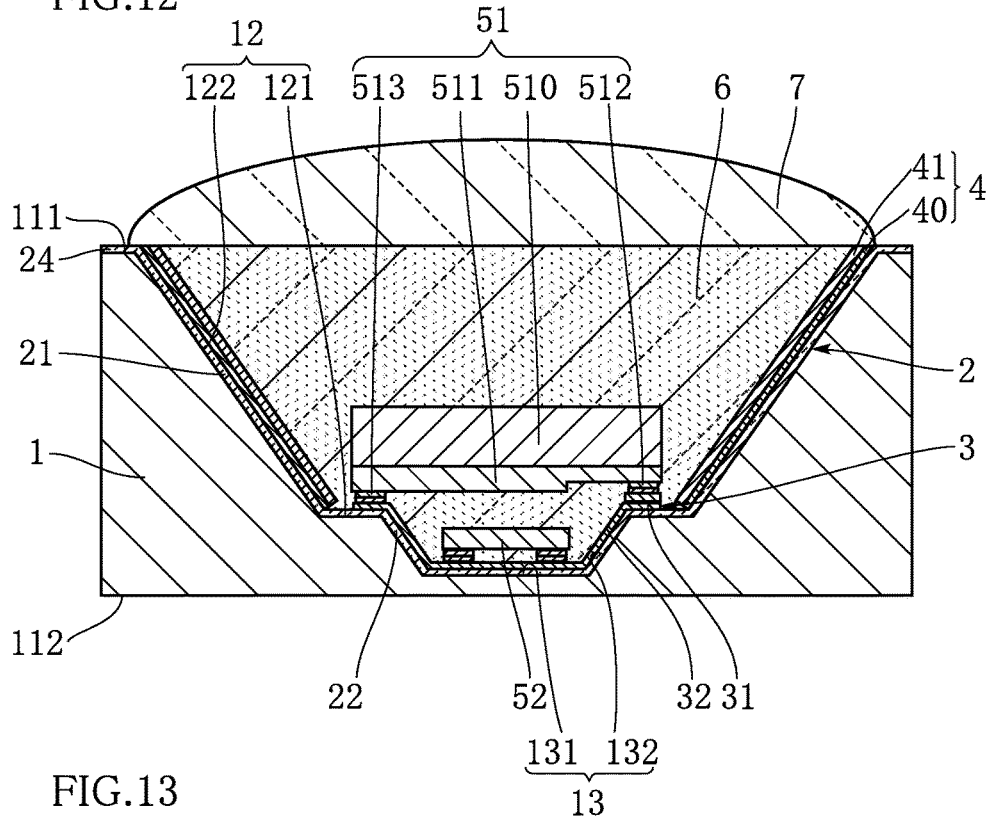
FIG. 12 is a cross-sectional view showing an example of a method for manufacturing the semiconductor light-emitting device in FIG. 1.

Next, as shown in FIG. 12, sealing resin 6 is formed. For example, a liquid material containing a fluorescent material and a highly-permeable transparent resin material mixed in the fluorescent material is filled in the LED-chip-receiving recess 12 and the obverse-side control-element-receiving recess 13 so as to cover the LED chip 51 and the control element 52. Then, the liquid material is cured to form the sealing resin 6.

Next, a lens member 7 is formed. The lens member 7 is formed by, for example, dripping a transparent resin material onto the sealing resin 6 and curing the transparent material.

Next, a lens member 7 is formed. The lens member 7 is formed by, for example, dripping a transparent resin material onto the sealing resin 6 and curing the transparent material.

Figure 13:
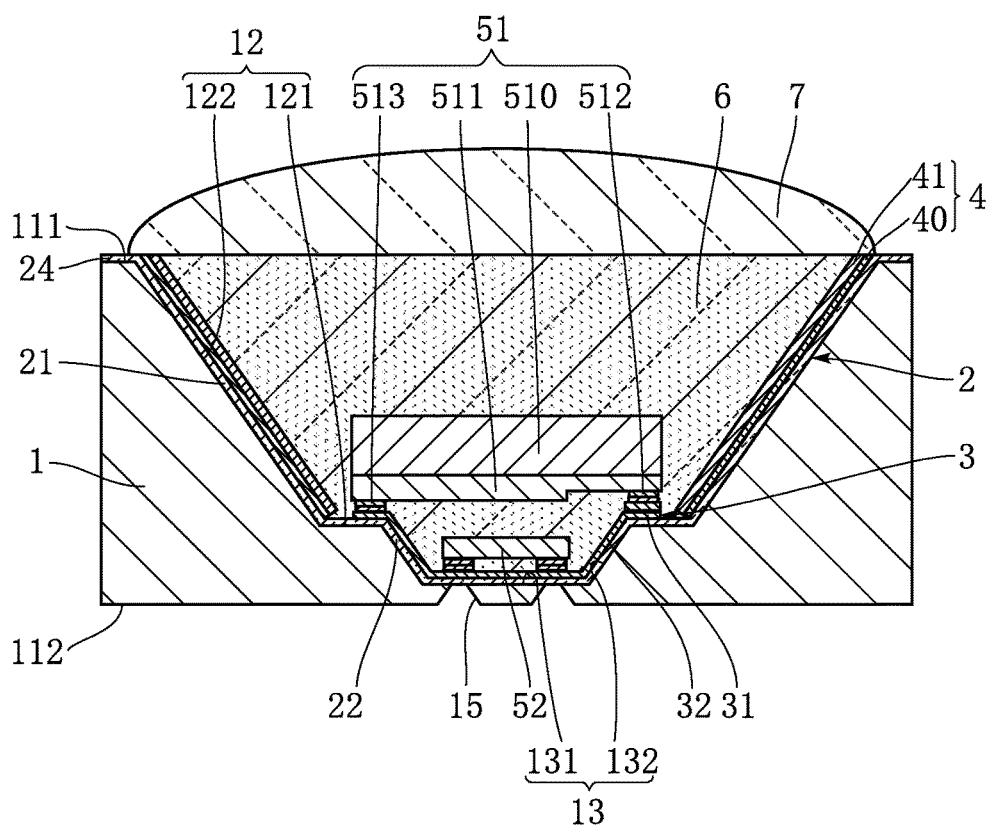
FIG. 13 is a cross-sectional view showing an example of a method for manufacturing the semiconductor light-emitting device in FIG. 1.
Figure 14:
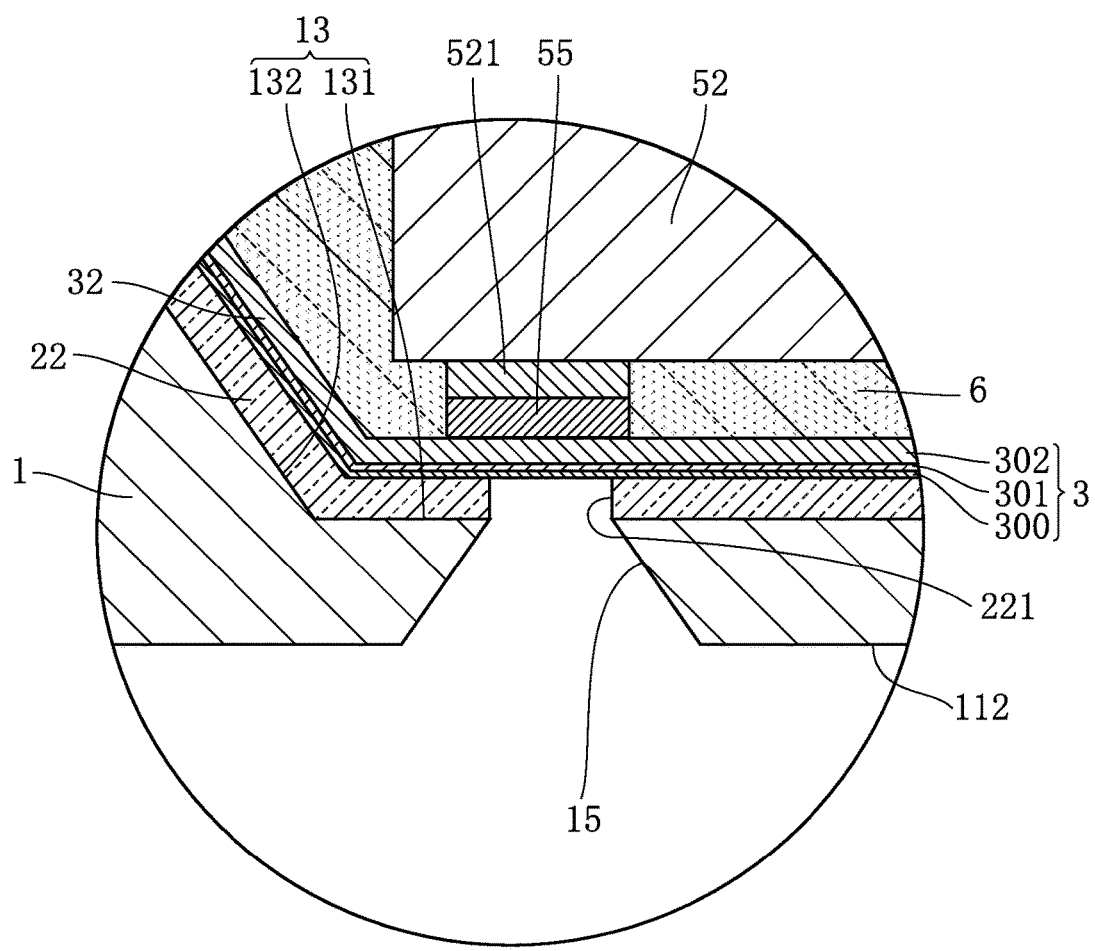
FIG. 14 is an enlarged cross-sectional view showing an example of a method for manufacturing the semiconductor light-emitting device in FIG. 1.
Figure 15:
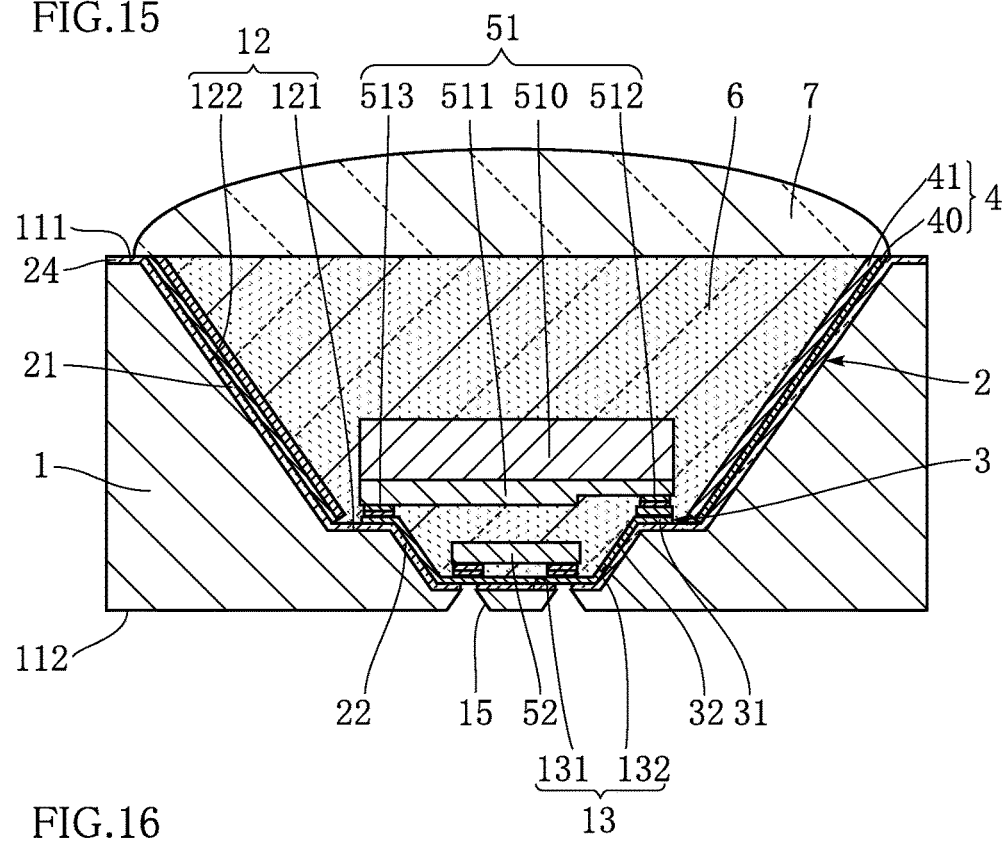
FIG. 15 is a cross-sectional view showing an example of a method for manufacturing the semiconductor light-emitting device in FIG. 1.

Next, as shown in FIG. 13, substrate through-holes 15 are formed. The substrate through-holes 15 are formed by anisotropic etching using KOH for example, after a mask layer is formed on the reverse surface 112 of the substrate 1. As a result, the substrate through-holes 15 that penetrate through the reverse surface 112 are formed. The etching stops at the obverse-side control-element-receiving recess insulating region 22 of the insulating layer 2. Next, as shown in FIGS. 14 and 15, insulating-layer through holes 221 are formed. The insulating-layer through holes 221 are formed by removing, through etching or the like, parts of the obverse-side control-element-receiving recess insulating region 22 exposed via the substrate through-holes 15. As a result, parts of the obverse-side control-element-receiving recess conductive region 32 are exposed from the substrate through-holes 15.

Figure 16:
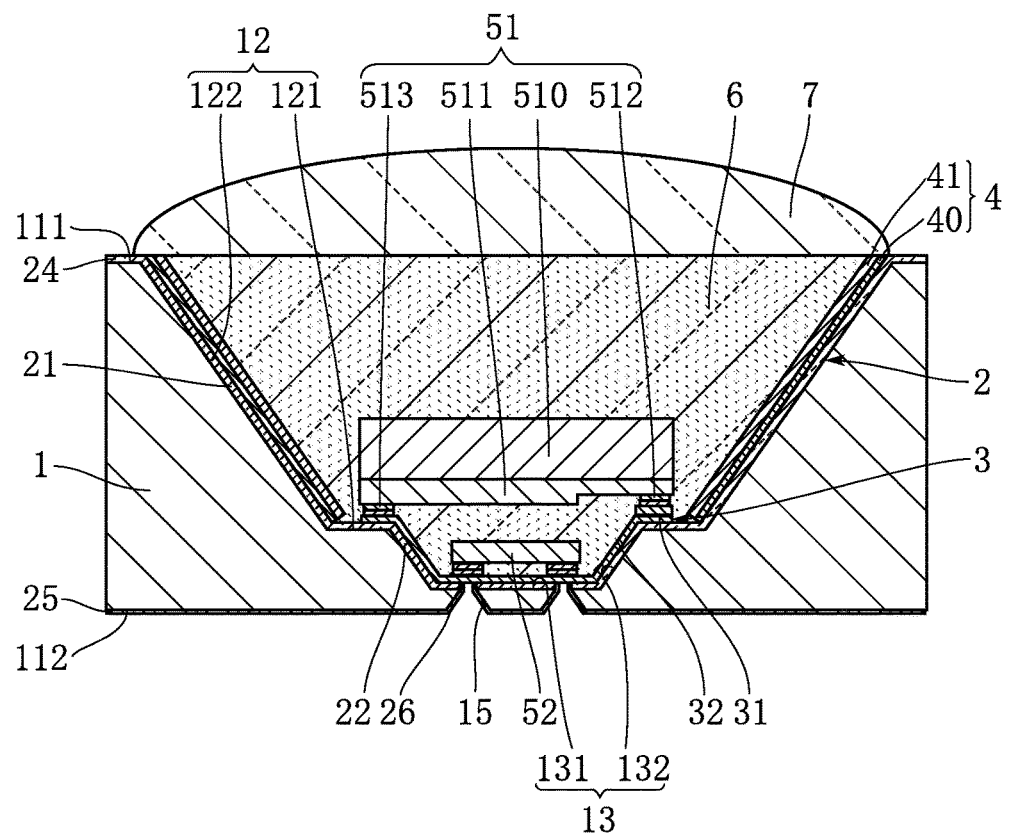
FIG. 16 is a cross-sectional view showing an example of a method for manufacturing the semiconductor light-emitting device in FIG. 1.

Next, as shown in FIG. 16, a reverse-surface insulating region 25 and a through-hole insulating region 26 are formed. The through-hole insulating region 26 is formed by forming a $SiO_2$ layer by sputtering or CVD, for example. The reverse-surface insulating region 25 may be formed together with the through-hole insulating region 26, by using the same method as the method for forming the through-hole insulating region 26, or may be formed by thermal oxidation.

Figure 17:
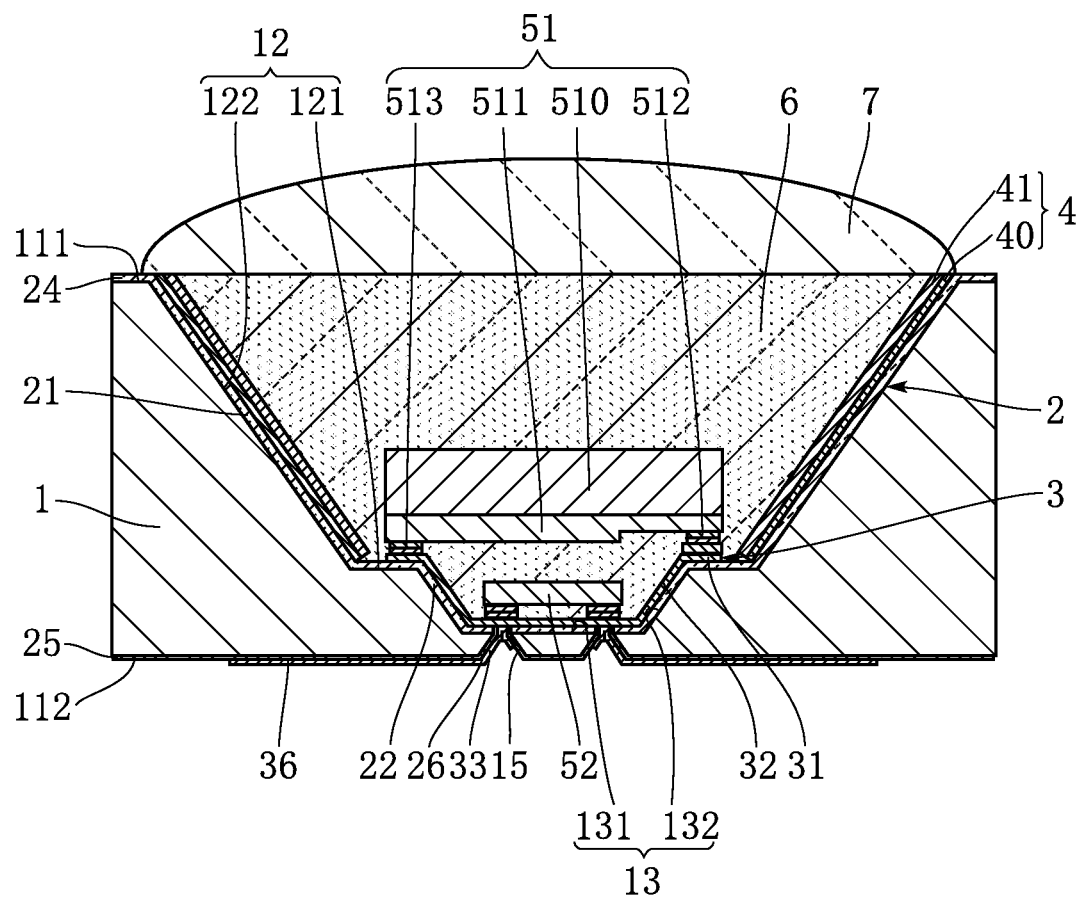
FIG. 17 is a cross-sectional view showing an example of a method for manufacturing the semiconductor light-emitting device in FIG. 1.

Next, as shown in FIG. 17, a substrate through-hole conductive region 33 and a reverse-surface conductive region 36 are formed. The substrate through-hole conductive region 33 and the reverse-surface conductive region 36 are formed in the same manner as the formation of the LED-chip-receiving recess conductive region 31 and the obverse-side control-element-receiving recess conductive region 32 described above. As a result of this formation, the substrate through-hole conductive region 33 makes contact with the obverse-side control-element-receiving recess conductive region 32 via the insulating-layer through holes 221.

Subsequently, a reverse-surface insulating film 82 and reverse-surface electrode pads 81 are formed. Then, the substrate 1 is cut off as necessary. Through the steps described above, the semiconductor light-emitting device A1 is formed.

The following describes the advantages of the semiconductor light-emitting device A1.

According to the present embodiment, the control element 52 is arranged between the LED chip 51 and the reverse surface 112 in the thickness direction of the substrate 1. This structure eliminates the need to arrange the LED chip 51 and the control element 52 separately from each other in plan view. As a result, the semiconductor light-emitting device A1 can be downsized.

The LED chip 51 and the control element 52 overlap with each other as viewed in the thickness direction of the substrate 1. This makes it possible to further downsize the semiconductor light-emitting device A1.

The obverse-side control-element-receiving recess 13 is recessed from the LED-chip-receiving recess bottom surface 121 of the LED-chip-receiving recess 12, and the control element 52 is arranged in the obverse-side control-element-receiving recess 13. This makes it possible to arrange the LED chip 51 and the control element 52 side by side in the thickness direction.

The obverse-side control-element-receiving recess side surfaces 132 are inclined relative to the thickness direction Z. This structure facilitates the obverse-side control-element-receiving recess side surfaces 132 to be formed relatively flat. This allows for greater ease in forming the underlying layer 300 (i.e., the conductive layer 3).

The substrate 1 has the substrate through-holes 15. As for the conductive layer 3, the LED-chip-receiving recess conductive region 31 and the obverse-side control-element-receiving recess conductive region 32 are electrically connected to the reverse-surface conductive region 36 via the substrate through-hole conductive region 33 formed in the substrate through-holes 15. This makes it possible to electrically connect the LED chip 51 and the control element 52 to, for example, a circuit board exterior to the semiconductor light-emitting device A1, with use of the reverse-surface electrode pads 81 arranged on the reverse surface 112.

The reflective layer 4 can reflect the light travelling from the LED chip 51 in the left-right direction in FIG. 2 to the upper side in FIG. 2. This makes it possible to enhance the luminance of the semiconductor light-emitting device A1.

The inclination of the LED-chip-receiving recess side surfaces 122 of the LED-chip-receiving recess 12 allows the reflective layer 4 to be appropriately formed.

FIGS. 18 to 30 show other embodiments of the present invention. In these figures, elements that are the same as or similar to the elements in the above embodiment are provided with the same reference signs as those in the above embodiment.

FIGS. 18 to 21 show a semiconductor light-emitting device according to a second embodiment of the present invention. A semiconductor light-emitting device A2 of the present embodiment differs from the semiconductor light-emitting device A1 described above in terms of the mounted form of the control element 52.

Figure 18:
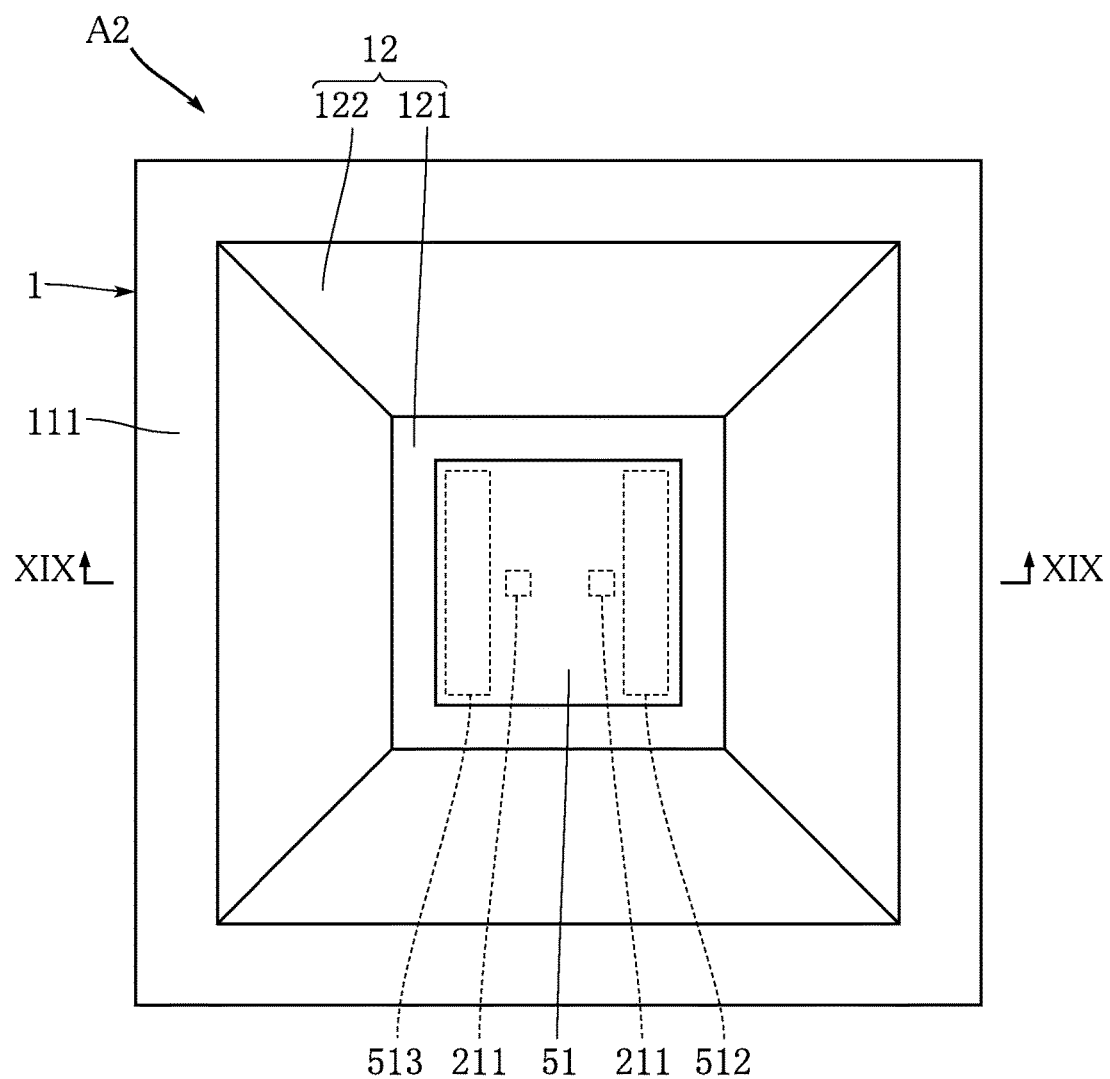
FIG. 18 is a plan view showing a main part of a semiconductor light-emitting device according to a second embodiment of the present invention.
Figure 19:
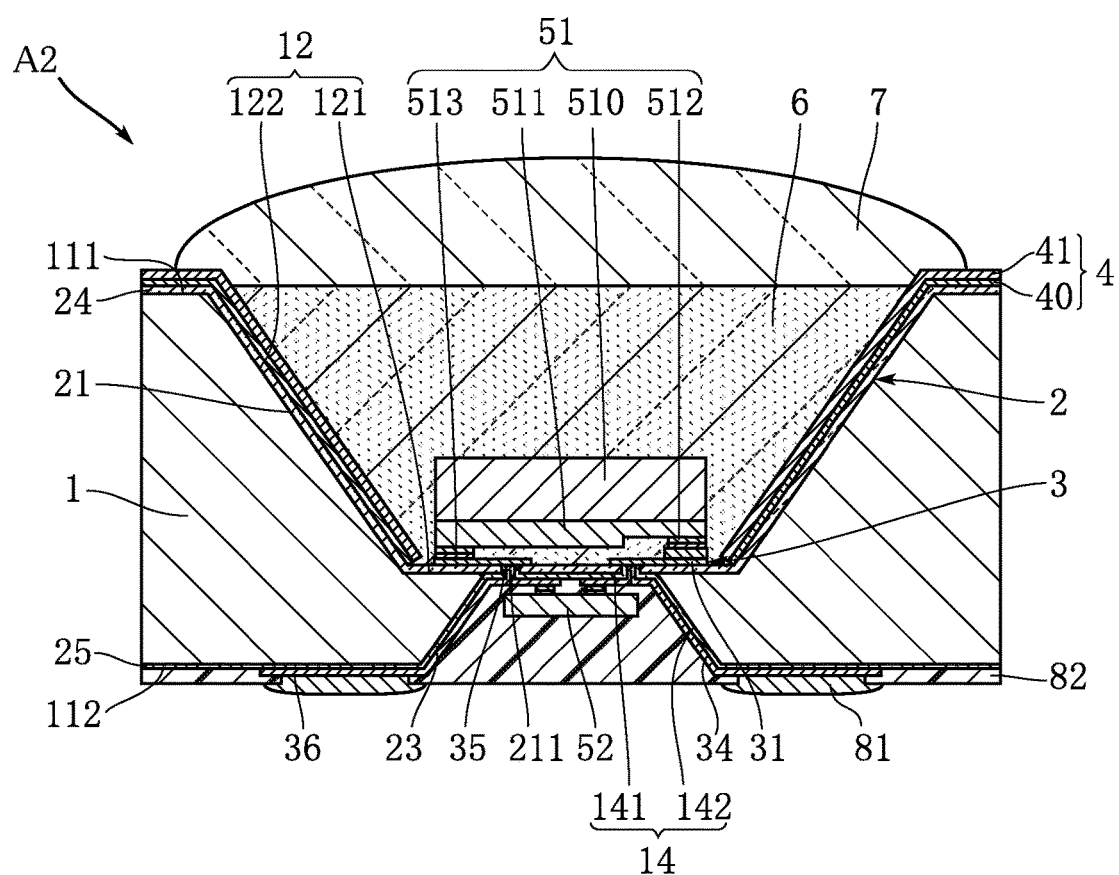
FIG. 19 is a cross-sectional view along a line XIX-XIX in FIG. 18.
Figure 20:
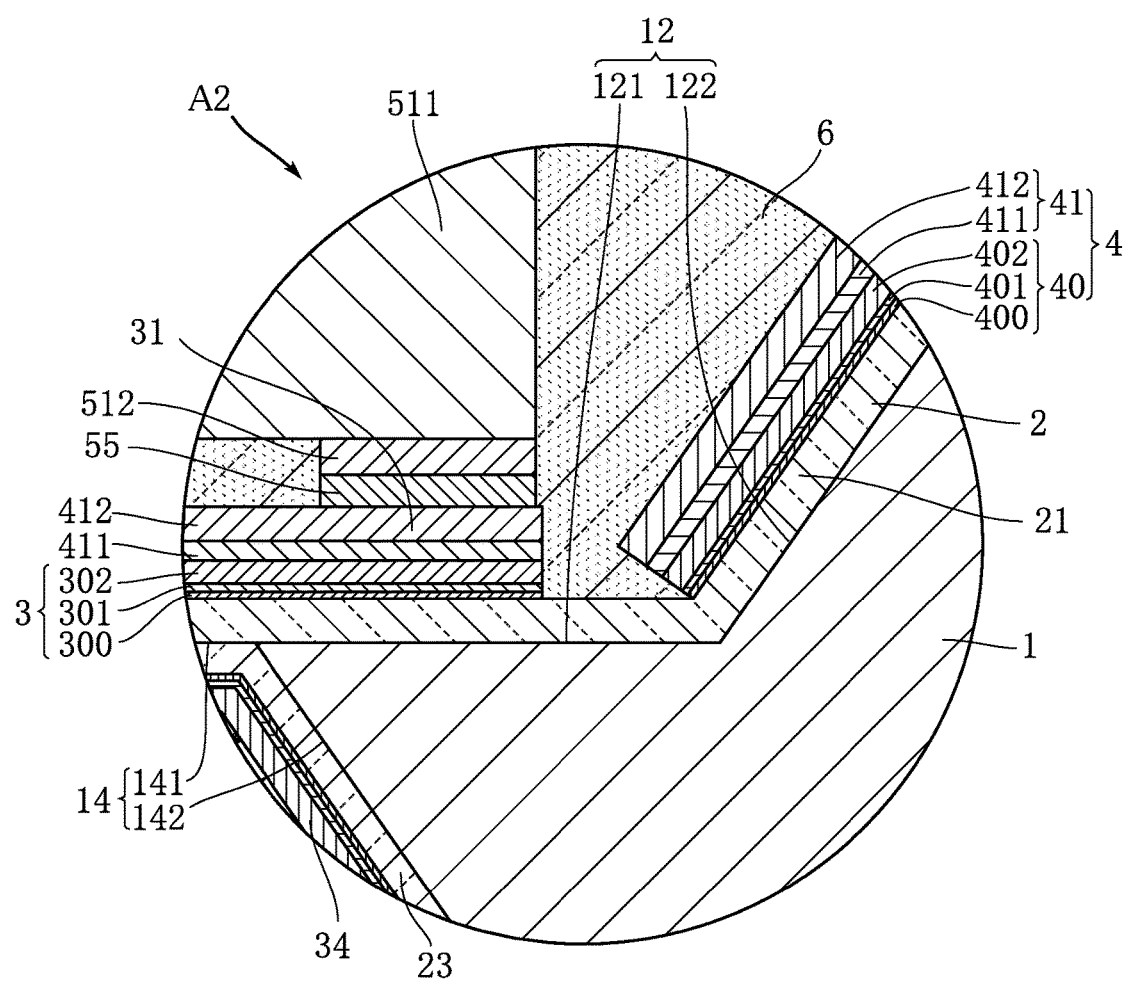
FIG. 20 is an enlarged cross-sectional view showing a main part of the semiconductor light-emitting device in FIG. 18.
Figure 21:
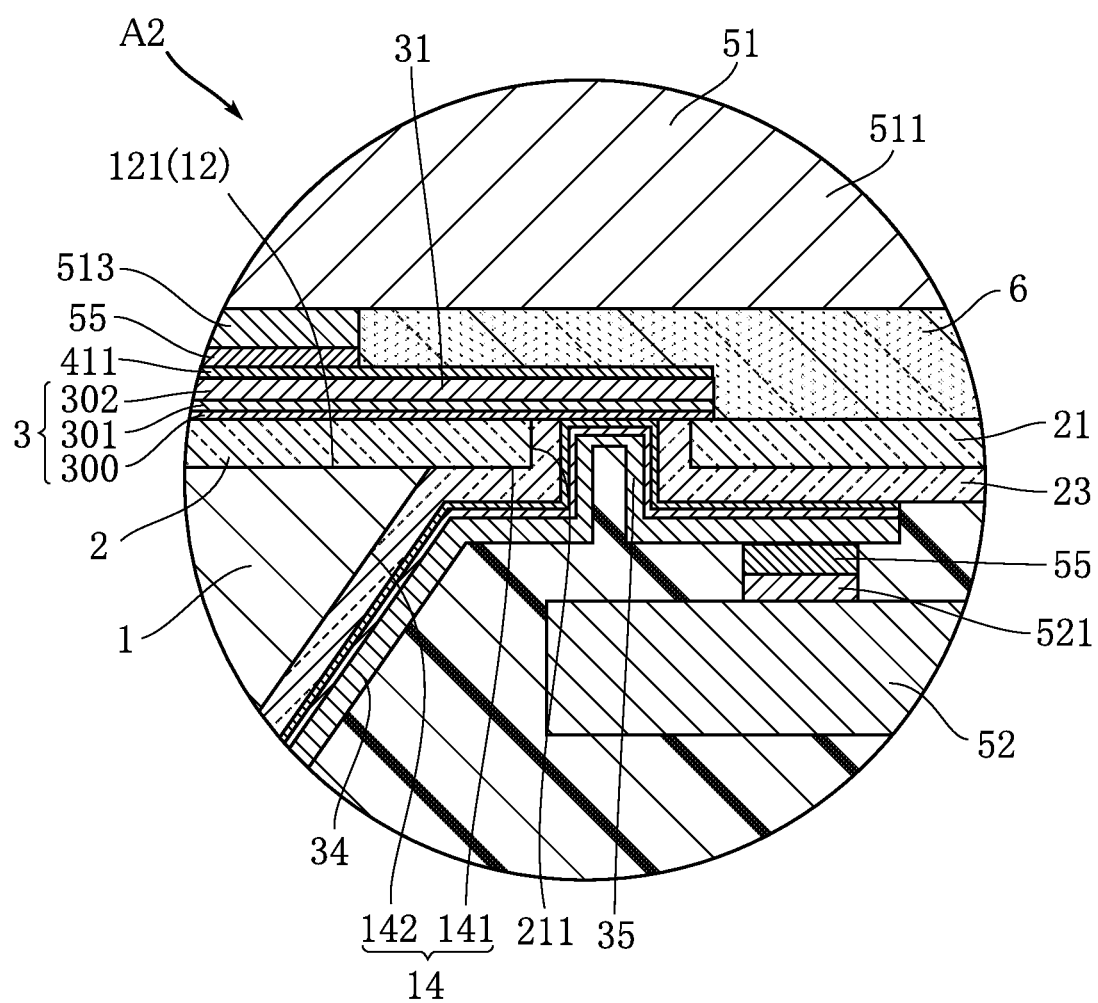
FIG. 21 is an enlarged cross-sectional view showing a main part of the semiconductor light-emitting device in FIG. 18.

FIG. 18 is a plan view showing a main part of the semiconductor light-emitting device A2 in a similar manner as in FIG. 1. FIG. 19 is a cross-sectional view along a line XIX-XIX in FIG. 18. FIGS. 20 and 21 are enlarged cross-sectional views showing main parts of the semiconductor light-emitting device A2.

In the present embodiment, an LED-chip-receiving recess 12 and a reverse-side control-element-receiving recess 14 are formed in a substrate 1.

The reverse-side control-element-receiving recess 14 is recessed from a reverse surface 112. A control element 52 is arranged in the reverse-side control-element-receiving recess 14. The reverse-side control-element-receiving recess 14 has a depth (a separation distance in the thickness direction between the reverse surface 112 and a reverse-side control-element-receiving recess bottom surface 141, which is described below) of 50 to 300 μm, for example. The reverse-side control-element-receiving recess 14 is rectangular as viewed in the thickness direction. The shape of the reverse-side control-element-receiving recess 14 results from the reverse surface 112 being a (100) surface.

The reverse-side control-element-receiving recess 14 has a reverse-side control-element-receiving recess bottom surface 141 and a reverse-side control-element-receiving recess side surfaces 142.

The reverse-side control-element-receiving recess bottom surface 141 faces the same side as the reverse surface 112 in the thickness direction of the substrate 1. The reverse-side control-element-receiving recess bottom surface 141 is rectangular as viewed in the thickness direction. The control element 52 is arranged on the reverse-side control-element-receiving recess bottom surface 141. The reverse-side control-element-receiving recess bottom surface 141 is perpendicular to the thickness direction.

The reverse-side control-element-receiving recess side surfaces 142 upstand from the reverse-side control-element-receiving recess bottom surface 141. The reverse-side control-element-receiving recess side surfaces 142 are continuous with the reverse surface 112. The reverse-side control-element-receiving recess side surfaces 142 are inclined relative to the thickness direction. The reverse-side control-element-receiving recess side surfaces 142 each form an angle of 55° with a plane perpendicular to the thickness direction. This results from the reverse surface 112 being a (100) surface. The reverse-side control-element-receiving recess side surfaces 142 are four in number and flat.

As can be clearly seen in FIG. 21, the reverse-side control-element-receiving recess side surfaces 142 according to the present embodiment are formed with the substrate 1 itself. On the other hand, the reverse-side control-element-receiving recess bottom surface 141 is formed with a surface of the LED-chip-receiving recess insulating region 21 of an insulating layer 2, specifically a surface of the LED-chip-receiving recess insulating region 21 at a side of the reverse surface 112. The LED-chip-receiving recess insulating region 21 has a plurality of insulating layer through-holes 211. The insulating layer through-holes 211 penetrate through from the LED-chip-receiving recess 12 to the reverse-side control-element-receiving recess 14. As shown in FIG. 18, two insulating layer through-holes 211 are formed in the present embodiment. The two insulating layer through-holes 211 are formed in a region sandwiched between an n-side electrode 512 and a p-side electrode 513 of an LED chip 51. The two insulating layer through-holes 211 are spaced apart in the left-right direction in FIG. 18.

The insulating layer 2 has a reverse-side control-element-receiving recess insulating region 23. The reverse-side control-element-receiving recess insulating region 23 covers at least a part of the reverse-side control-element-receiving recess 14. In the present embodiment, the reverse-side control-element-receiving recess insulating region 23 covers all of the reverse-side control-element-receiving recess side surfaces 142 and the reverse-side control-element-receiving recess bottom surface 141 of the reverse-side control-element-receiving recess 14. Also, the reverse-side control-element-receiving recess insulating region 23 covers inner surfaces of the insulating layer through-holes 211. Note that the reverse-side control-element-receiving recess insulating region 23 does not block the insulating layer through-holes 211. This causes the LED-chip-receiving recess conductive region 31 of the conductive layer 3 to be exposed to the reverse surface 112 from openings of the insulating layer through-holes 211 located on a side of the obverse surface 111.

The conductive layer 3 includes a reverse-side control-element-receiving recess conductive region 34 and an insulating layer through-hole conductive region 35.

The reverse-side control-element-receiving recess conductive region 34 is formed in the reverse-side control-element-receiving recess 14. In the present embodiment, a substrate through-hole conductive region 33 includes portions formed on the reverse-side control-element-receiving recess bottom surface 141 on the reverse-side control-element-receiving recess side surfaces 142. The substrate through-hole conductive region 33 formed on the reverse-side control-element-receiving recess bottom surface 141 is used to mount a mounting terminal 521 of the control element 52 on the reverse-side control-element-receiving recess bottom surface 141 via the solder 55.

The insulating layer through-hole conductive region 35 includes a portion formed on inner surfaces of the insulating layer through-holes 211. As shown in FIG. 21, the insulating layer through-hole conductive region 35 according to the present embodiment is stacked on the reverse-side control-element-receiving recess insulating region 23 of the insulating layer 2, at the inner surfaces of the insulating layer through-holes 211. Also, the insulating layer through-hole conductive region 35 is in contact with the LED-chip-receiving recess conductive region 31 at the openings of the insulating layer through-holes 211 located on the side of the obverse surface 111.

As shown in FIG. 21, in the present embodiment, layers corresponding to a base layer 40 and a Ag layer 41 of a reflective layer 4 are not stacked on the reverse-side control-element-receiving recess conductive region 34 and the insulating layer through-hole conductive region 35. However, similarly to the LED-chip-receiving recess conductive region 31, a layer corresponding to the base layer 40 may be stacked on the reverse-side control-element-receiving recess conductive region 34 and the insulating layer through-hole conductive region 35.

In the present embodiment, the insulating layer 2 does not have an obverse-surface insulating region 24. In other words, although it is preferable that the obverse-surface insulating region 24 be arranged in order to prevent the inappropriate electrical conduction of the substrate 1, the obverse-surface insulating region 24 may be omitted.

The following describes a method for manufacturing the semiconductor light-emitting device A2, with reference to FIGS. 22 to 27.

Figure 22:
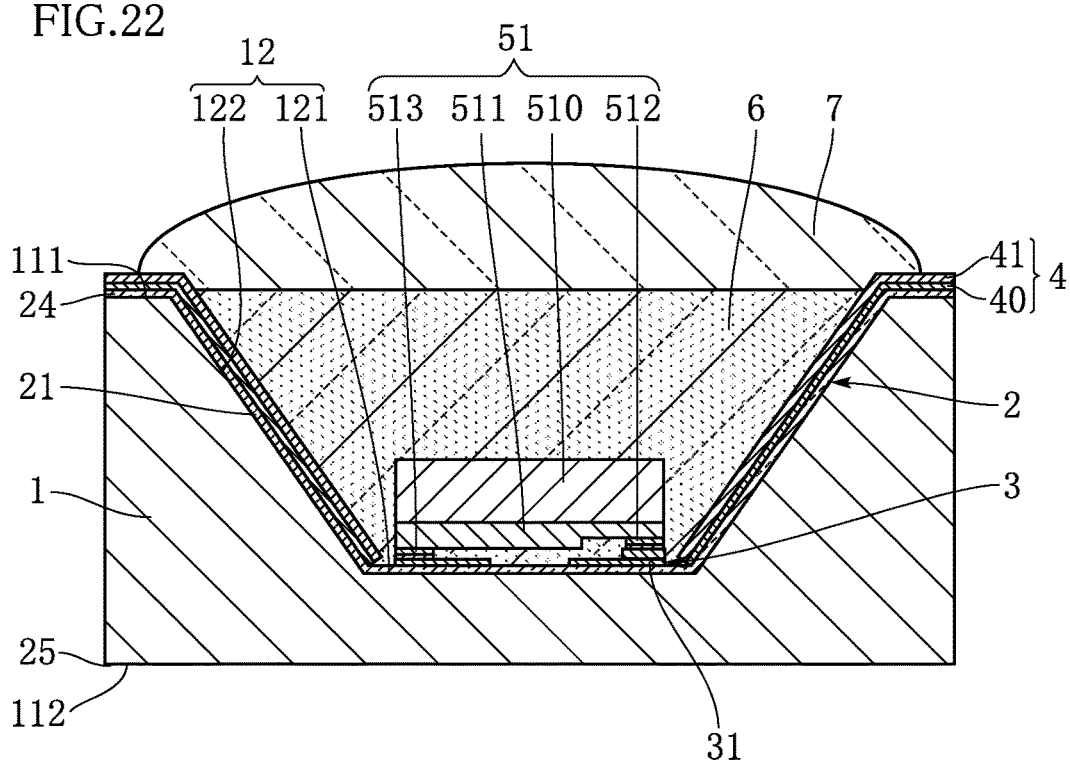
FIG. 22 is a cross-sectional view showing an example of a method for manufacturing the semiconductor light-emitting device in FIG. 18.

First, the same steps as the steps in the method for manufacturing the semiconductor light-emitting device A1 are performed so as to manufacture an intermediate product as shown in FIG. 22. As for this intermediate product, an LED-chip-receiving recess 12 is formed in a substrate 1, and an LED chip 51 is arranged in the recess 12. Sealing resin 6 and a lens member 7 are also formed. Note that the lens member 7 may be formed upon completion of the following steps. At this point, a reverse-side control-element-receiving recess 14 has not yet been formed in the substrate 1.

Figure 23:
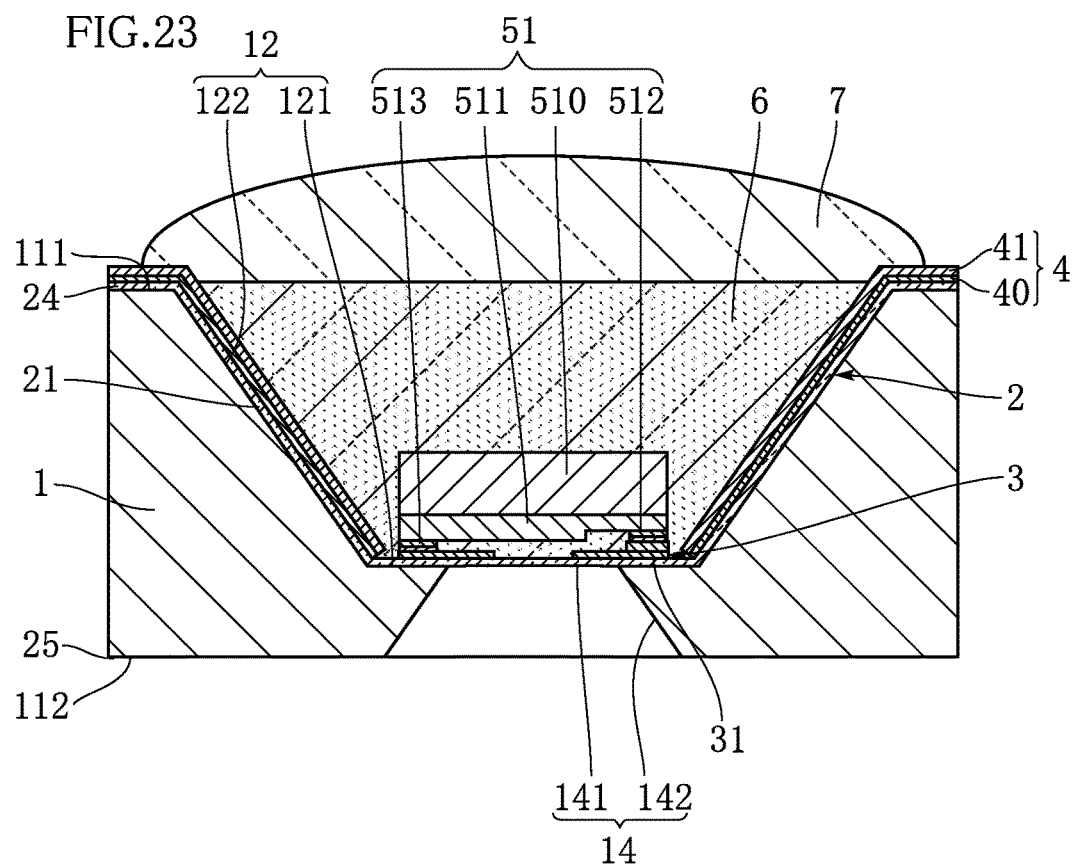
FIG. 23 is a cross-sectional view showing an example of a method for manufacturing the semiconductor light-emitting device in FIG. 18.
Figure 24:
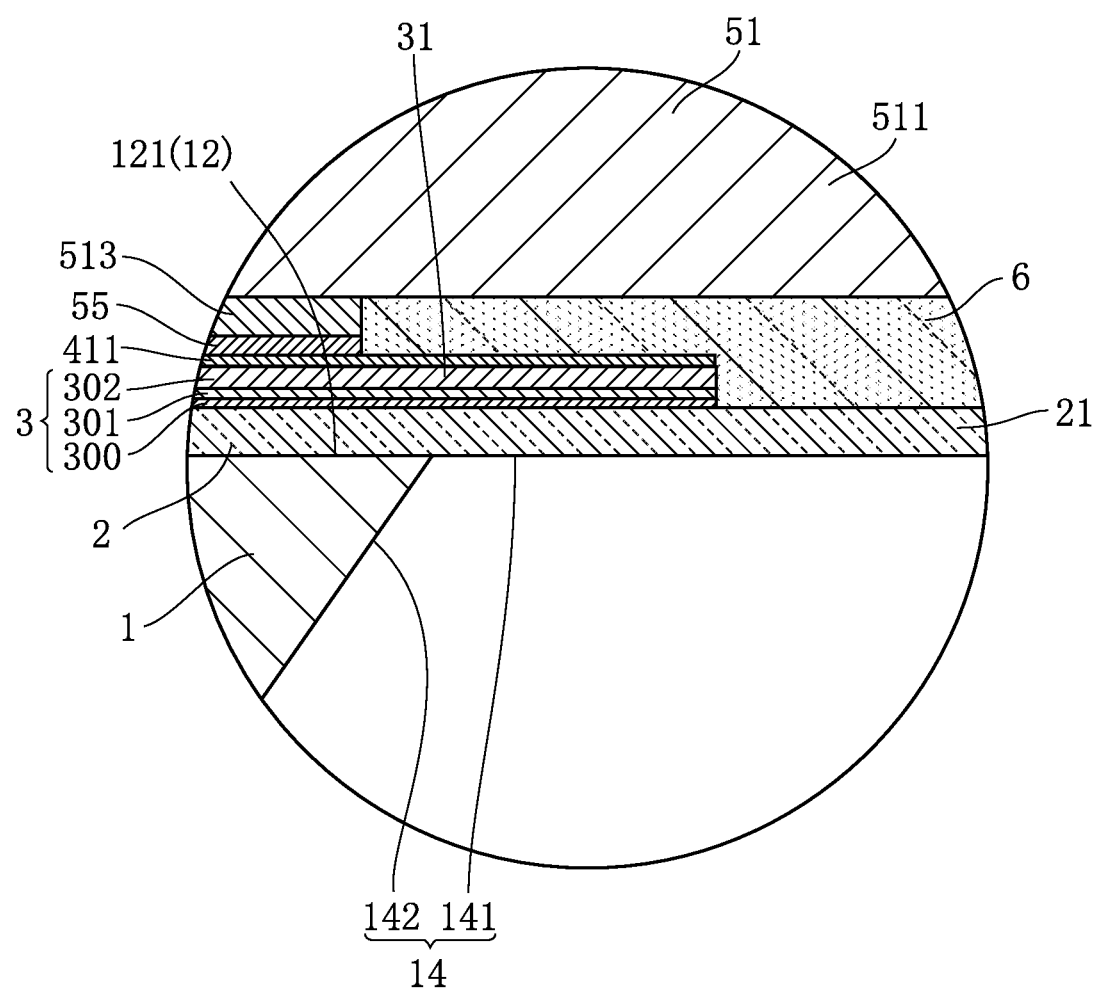
FIG. 24 is an enlarged cross-sectional view showing an example of a method for manufacturing the semiconductor light-emitting device in FIG. 18.

Next, as shown in FIG. 23, a reverse-side control-element-receiving recess 14 is formed. The reverse-side control-element-receiving recess 14 is formed by anisotropic etching using KOH for example, after a mask layer is formed on a reverse surface 112. The etching stops at an LED-chip-receiving recess insulating region 21 of an insulating layer 2. As a result, as shown in FIG. 24, a reverse-side control-element-receiving recess bottom surface 141 of a reverse-side control-element-receiving recess 14 is formed with an LED-chip-receiving recess insulating region 21 of an insulating layer 2, and reverse-side control-element-receiving recess side surfaces 142 of the recess 14 is formed with the substrate 1 itself.

Figure 25:
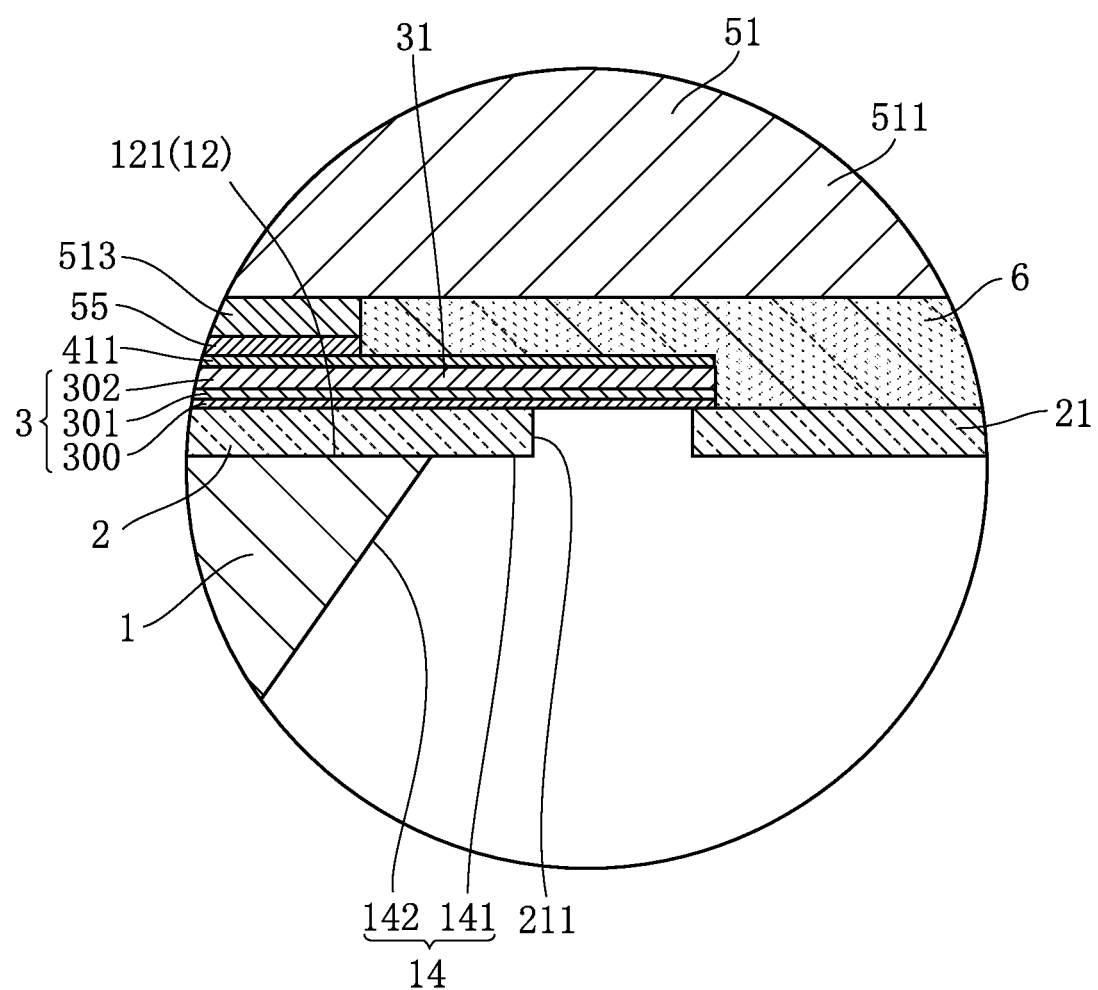
FIG. 25 is an enlarged cross-sectional view showing an example of a method for manufacturing the semiconductor light-emitting device in FIG. 18.

Next, as shown in FIG. 25, insulating layer through-holes 211 are formed in the LED-chip-receiving recess insulating region 21, The insulating layer through-holes 211 are formed by dry etching, for example.

Figure 26:
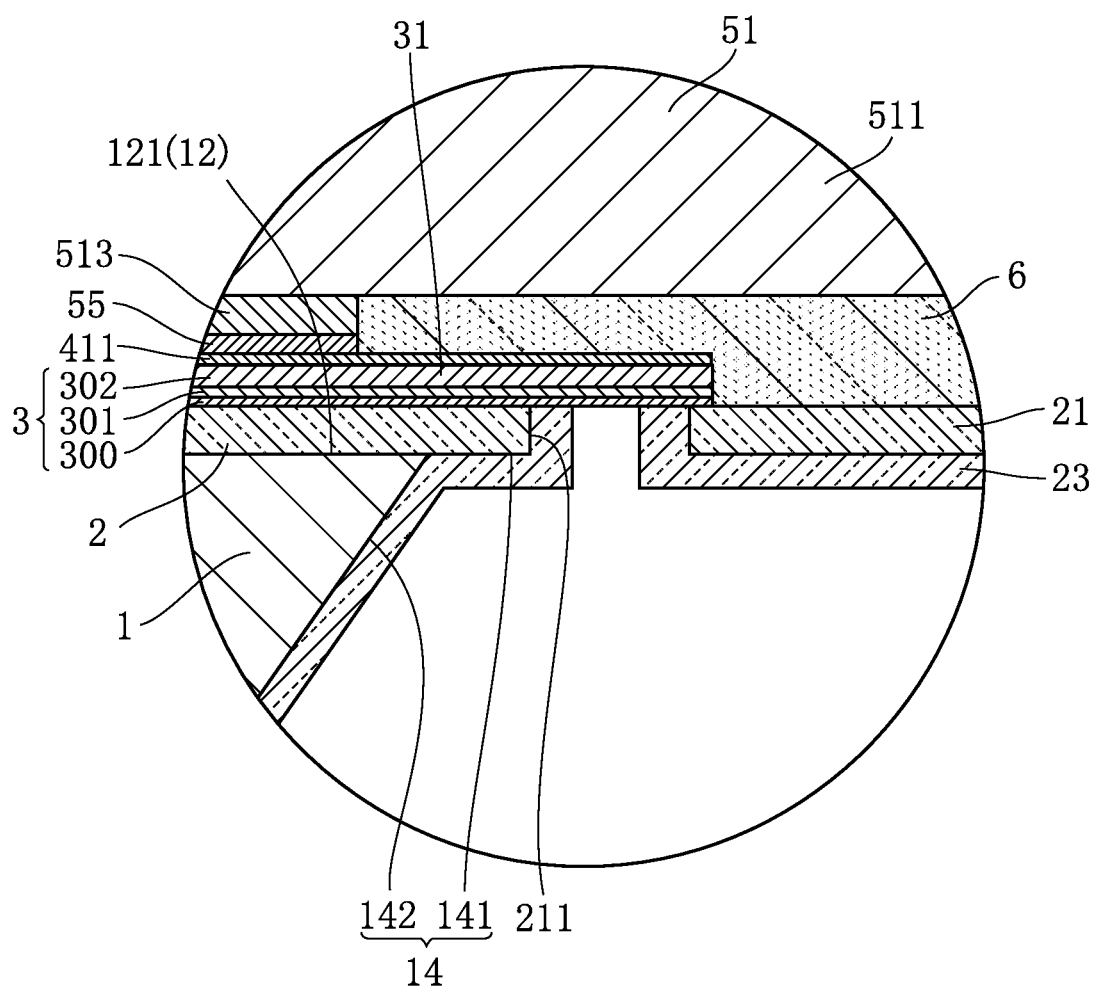
FIG. 26 is an enlarged cross-sectional view showing an example of a method for manufacturing the semiconductor light-emitting device in FIG. 18.

Next, as shown in FIG. 26, a reverse-side control-element-receiving recess insulating region 23 is formed. The reverse-side control-element-receiving recess insulating region 23 is formed by CVD, for example. The reverse-side control-element-receiving recess insulating region 23 is made of $SiO_2$ or SiN, for example. Note that the reverse-side control-element-receiving recess insulating region 23 does not block the insulating layer through-holes 211.

Figure 27:
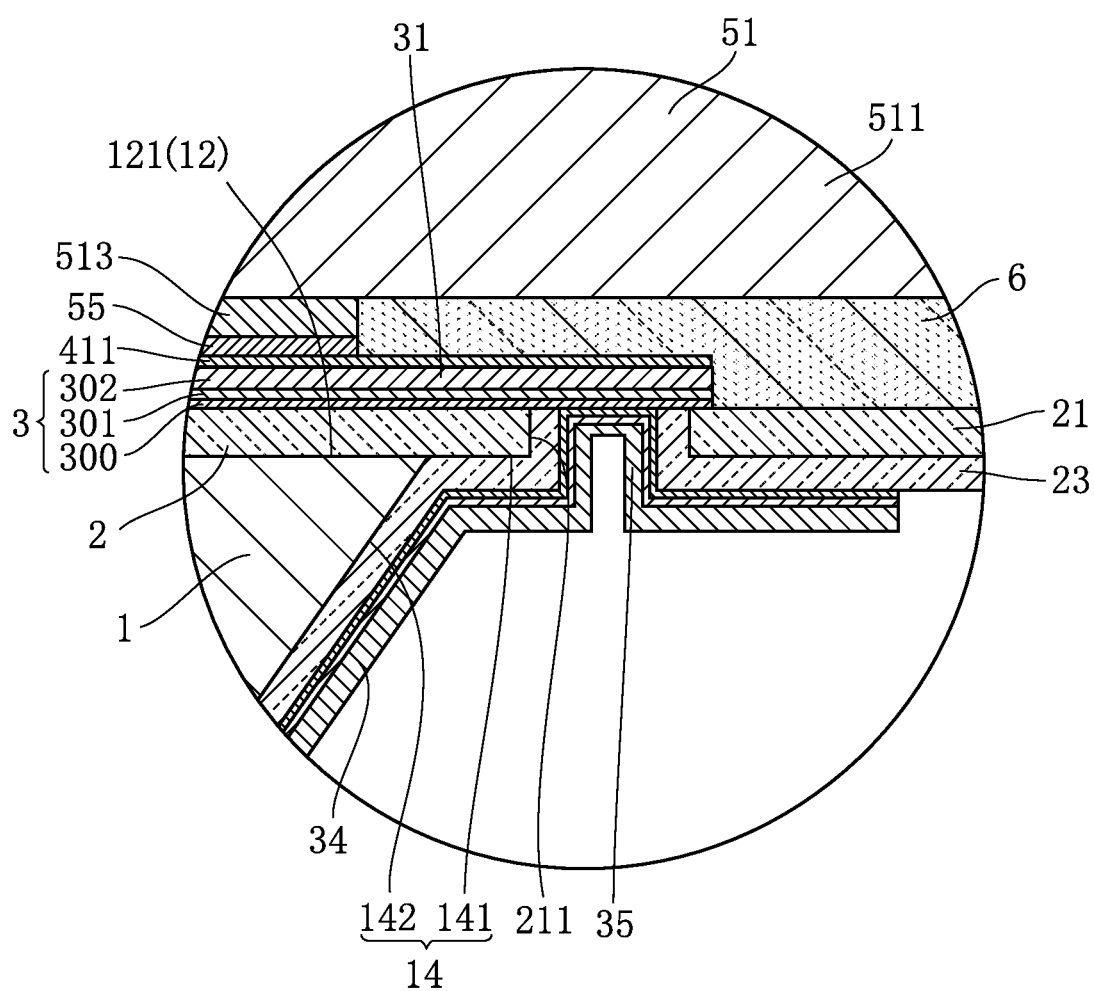
FIG. 27 is an enlarged cross-sectional view showing an example of a method for manufacturing the semiconductor light-emitting device in FIG. 18.

Next, as shown in FIG. 27, a reverse-side control-element-receiving recess conductive region 34 is formed. The reverse-side control-element-receiving recess conductive region 34 is then used to mount a control element 52 at the reverse-side control-element-receiving recess bottom surface 141 of the reverse-side control-element-receiving recess 14. Then, a reverse-surface insulating film 82 is formed to cover the control element 52. Subsequently, reverse-surface electrode pads 81 are formed. Through the steps described above, the semiconductor light-emitting device A2 is formed.

The present embodiment can reduce the size of the semiconductor light-emitting device A2. The size of the reverse-side control-element-receiving recess bottom surface 141 of the reverse-side control-element-receiving recess 14 is not limited to the size of the area sandwiched between the n-side electrode 512 and the p-side electrode 513 of the LED chip 51. That is, in FIG. 19, the reverse-side control-element-receiving recess bottom surface 141 of the reverse-side control-element-receiving recess 14 may have a size that overlaps the n-side electrode 512 and the p-side electrode 513 of the LED chip 51 as viewed in the thickness direction. This makes it possible to arrange a relatively large control element 52.

Figure 28:
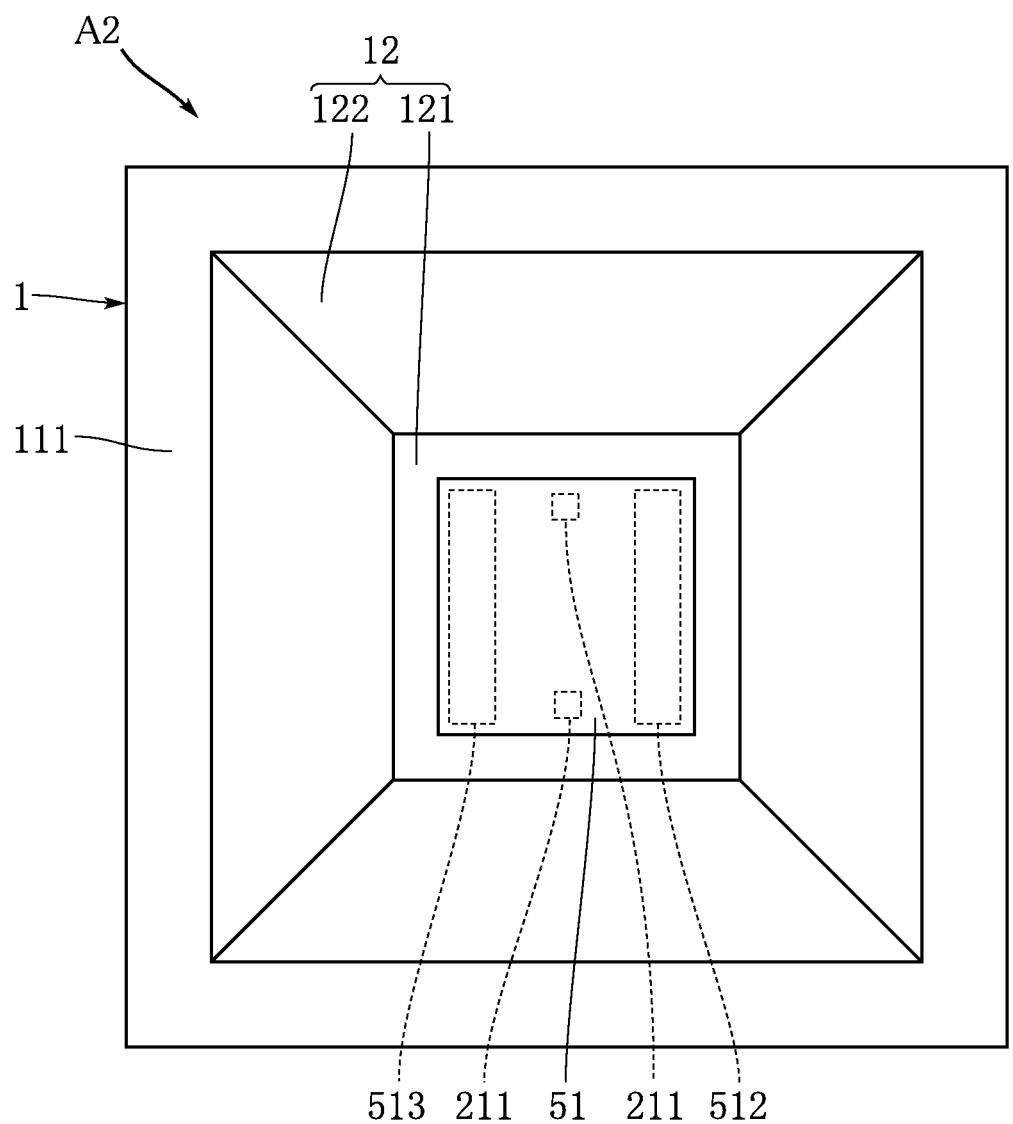
FIG. 28 is a plan view showing a main part of a variation of the semiconductor light-emitting device according to the second embodiment of the present invention.

FIG. 28 shows a variation of the semiconductor light-emitting device A2. In the present variation, the two insulating layer through-holes 211 are arranged separately in an up-and-down direction in the figure, in the region sandwiched between the n-side electrode 512 and the p-side electrode 513. In plan view, the n-side electrode 512 is connected to one of the insulating layer through-holes 211 via a part of the LED-chip-receiving recess conductive region 31, and the p-side electrode 513 is connected to the other insulating layer through-hole 211 via another part of the LED-chip-receiving recess conductive region 31.

Such a variation can also reduce the size of the semiconductor light-emitting device A2.

Figure 29:
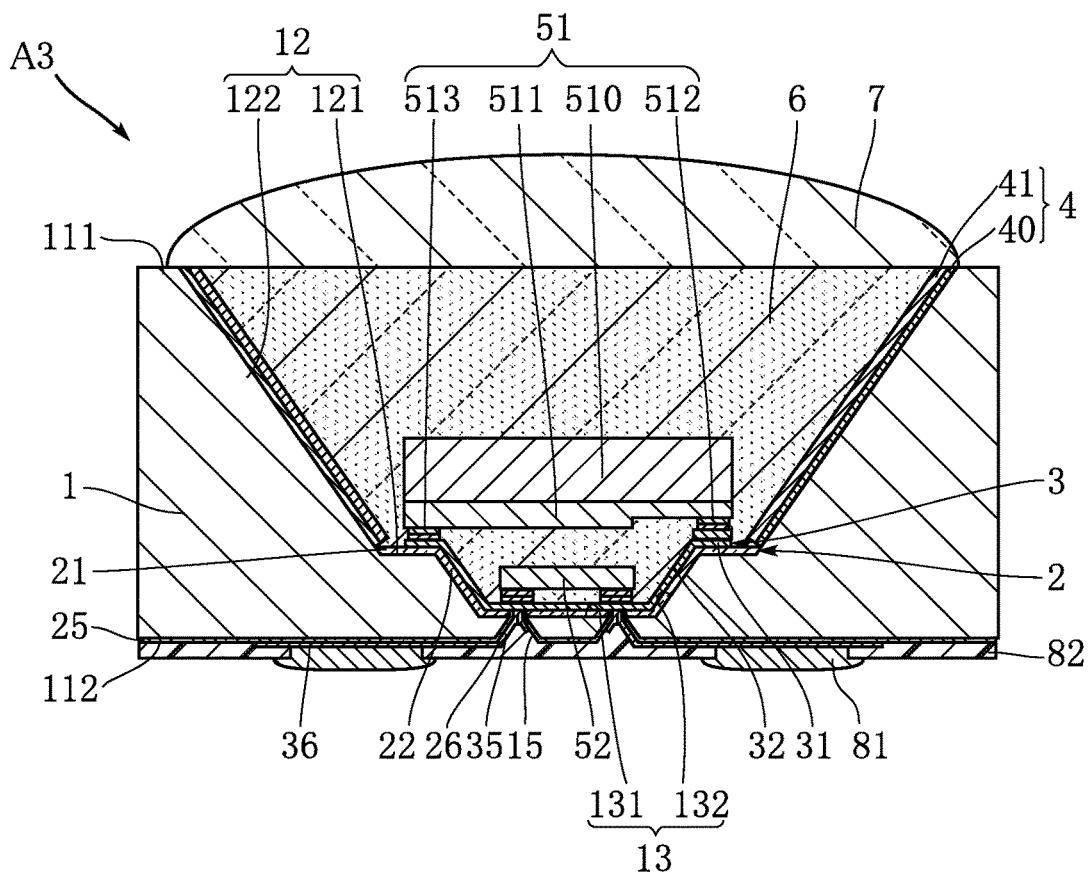
FIG. 29 is a cross-sectional view showing a semiconductor light-emitting device according to a third embodiment of the present invention.
Figure 30:
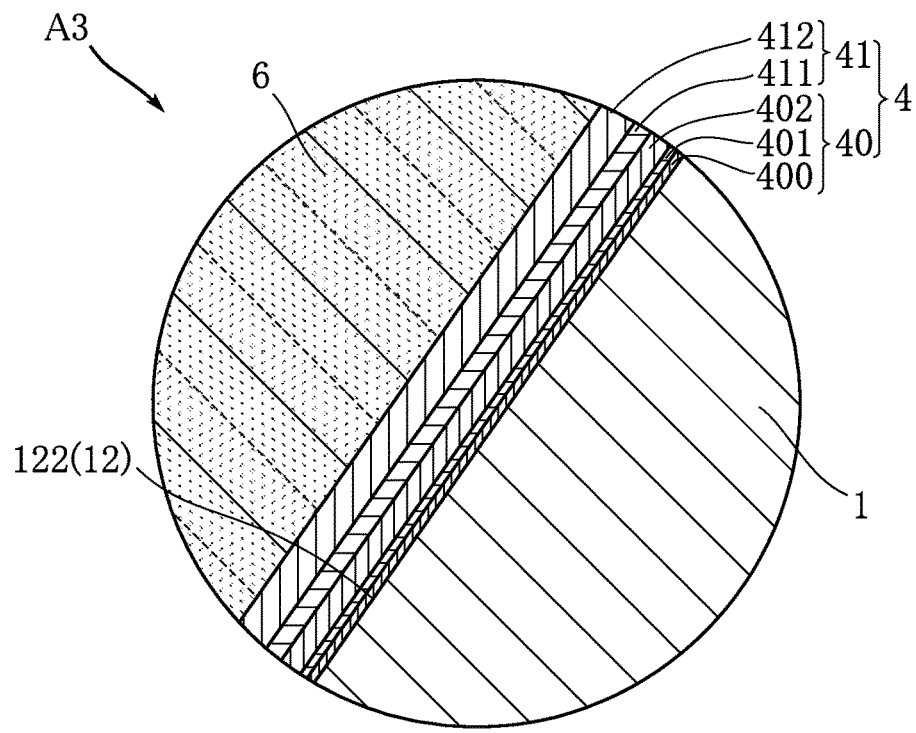
FIG. 30 is an enlarged cross-sectional view showing a main part of the semiconductor light-emitting device in FIG. 29.

FIGS. 29 and 30 show a semiconductor light-emitting device according to a third embodiment of the present invention. The present embodiment differs from the above embodiments chiefly in terms of the arrangement of a reflective layer 4 in a semiconductor light-emitting device A3. The basic structure of the semiconductor light-emitting device A3 is similar to that of the semiconductor light-emitting device A1, but may instead be similar to that of the semiconductor light-emitting device A2.

As can be clearly seen in FIG. 30, the reflective layer 4 according to the present embodiment is directly formed on a substrate 1 without intervention of an insulating layer 2. The reflective layer 4 according to the present embodiment is also made up of a base layer 40 and a Ag layer 41. An underlying layer 400 of the base layer 40 is directly formed on LED-chip-receiving recess side surfaces 122 of an LED-chip-receiving recess 12 of the substrate 1. In the present embodiment, the reflective layer 4 is entirely insulated from a conductive layer 3.

The present embodiment can also reduce the size of the semiconductor light-emitting device A3. In addition, since the reflective layer 4 is directly formed on the substrate 1, heat can be more easily conducted from the reflective layer 4 to the substrate 1. This is advantageous in dissipating heat from an LED chip 51. Also, the LED-chip-receiving recess side surfaces 122 of the LED-chip-receiving recess 12 formed in the aforementioned method are relatively smooth. Since the reflective layer 4 is directly formed on the LED-chip-receiving recess side surfaces 122 that are smooth as described above, the reflective layer 4 is prevented from having an undesirably rough surface.

A semiconductor light-emitting device according to the present invention should not be limited to the embodiments described above. Various design changes can be made to the specific configurations of the elements of a semiconductor light-emitting device according to the present invention.

The invnetion claimed is:

1. A semiconductor light-emitting device, comprising:
   a semiconductor substrate having an obverse surface and a reverse surface that are spaced apart from each other in a thickness direction of the substrate;
   an LED chip;
   a control element for controlling light emission of the LED chip;
   a conductive layer electrically connected to the LED chip and the control element; and
   an insulating layer disposed between the substrate and at least a part of the conductive layer,
   wherein the substrate is formed with a first recess that is recessed from the obverse surface and houses the LED chip, and
   the control element is arranged between the LED chip and the reverse surface of the substrate in the thickness direction.

2. The semiconductor light-emitting device according to claim 1, wherein the LED chip and the control element overlap with each other as viewed in the thickness direction.

3. The semiconductor light-emitting device according to claim 1, wherein the first recess has a first bottom surface that faces in a same direction as the obverse surface of the substrate, and
   the LED chip is arranged on the first bottom surface.

4. The semiconductor light-emitting device according to claim 3, wherein the first bottom surface is perpendicular to the thickness direction.

5. The semiconductor light-emitting device according to claim 3, wherein the first recess has a first side surface that upstands from the first bottom surface.

6. The semiconductor light-emitting device according to claim 5, wherein the first side surface is inclined relative to the thickness direction.

7. The semiconductor light-emitting device according to claim 5, wherein the first side surface is continuous with the obverse surface of the substrate.

8. The semiconductor light-emitting device according to claim 5, wherein the substrate is formed with a second recess that is recessed from the first bottom surface and houses the control element.

9. The semiconductor light-emitting device according to claim 8, wherein the second recess has an second bottom surface that faces in a same direction as the obverse surface of the substrate, and
   the control element is arranged on the second bottom surface.

10. The semiconductor light-emitting device according to claim 9, wherein the second bottom surface is perpendicular to the thickness direction.

11. The semiconductor light-emitting device according to claim 9, wherein the second recess has a second side surface that upstands from the second bottom surface and is continuous with the first bottom surface.

12. The semiconductor light-emitting device according to claim 11, wherein the second side surface is inclined relative to the thickness direction.

13. The semiconductor light-emitting device according to claim 5, wherein the substrate is formed with a through-hole that extends from the second recess to the reverse surface of the substrate.

14. The semiconductor light-emitting device according to claim 13, wherein the conductive layer comprises a first conductive region, a second conductive region and a third conductive region, the first conductive region being formed in the second recess, the second conductive region being formed on the reverse surface of the substrate, the third conductive region being formed in the through-hole and connecting the first conductive region and the second conductive region.

15. The semiconductor light-emitting device according to claim 14, further comprising an electrode pad arranged on the reverse surface of the substrate and electrically connected to the second conductive region.

16. The semiconductor light-emitting device according to claim 5, wherein the substrate is formed with a second recess that is recessed from the reverse surface of the substrate and houses the control element.

17. The semiconductor light-emitting device according to claim 16, wherein the second recess has a second bottom surface that faces in a same direction as the reverse surface of the substrate, and
the control element is arranged on the second bottom surface.

18. The semiconductor light-emitting device according to claim 17, wherein the second bottom surface is perpendicular to the thickness direction.

19. The semiconductor light-emitting device according to claim 17, wherein the second recess has a second side surface that upstands from the second bottom surface and is continuous with the reverse surface of the substrate.

20. The semiconductor light-emitting device according to claim 19, wherein the second side surface is inclined relative to the thickness direction.

21. The semiconductor light-emitting device according to claim 17, wherein the insulating layer comprises a first insulating region formed on the first bottom surface.

22. The semiconductor light-emitting device according to claim 21, wherein at least a part of the first insulating region forms the second bottom surface.

23. The semiconductor light-emitting device according to claim 22, wherein the first insulating region is formed with a through-hole penetrating from the first recess to the second recess.

24. The semiconductor light-emitting device according to claim 23, wherein the conductive layer comprises a first conductive region, a second conductive region, a third conductive region and a fourth conductive region, the first conductive region being formed in the first recess, the second conductive region being formed on the reverse surface of the substrate, the third conductive region being formed in the second recess and continuous with the second conductive region, the fourth conductive region being formed in the through-hole and connecting the first conductive region and the third conductive region to each other.

25. The semiconductor light-emitting device according to claim 24, further comprising an electrode pad that is arranged on the reverse surface of the substrate and electrically connected to the second conductive region.

26. The semiconductor light-emitting device according to claim 5, further comprising a reflective layer formed on the first side surface.

27. The semiconductor light-emitting device according to claim 26, wherein the reflective layer is made of a metal.

28. The semiconductor light-emitting device according to claim 27, wherein the reflective layer comprises an Ag layer on which light emitted from the LED chip is incident.

29. The semiconductor light-emitting device according to claim 28, wherein the reflective layer comprises a base layer disposed between the substrate and the Ag layer, the base layer having a same layer structure as the conductive layer.

30. The semiconductor light-emitting device according to claim 26, wherein the reflective layer is in direct contact with the first side surface.

31. The semiconductor light-emitting device according to claim 1, further comprising a sealing resin that fills the first recess and covers the LED chip.

32. The semiconductor light-emitting device according to claim 31, wherein the sealing resin contains a transparent resin material and a fluorescent material that is mixed in the resin material and excited by light emitted from the LED chip.

33. The semiconductor light-emitting device according to claim 31, further comprising a lens member covering the sealing resin.

34. The semiconductor light-emitting device according to claim 1, wherein the LED chip is of a flip-chip type.

* * * * *